(12) United States Patent
Seong

(10) Patent No.: US 10,720,191 B2
(45) Date of Patent: Jul. 21, 2020

(54) STORAGE DEVICE INCLUDING CALIBRATION DEVICE

(71) Applicant: Samsung Electronics Co., Ltd., Suwon-si, Gyeonggi-do (KR)

(72) Inventor: Kihwan Seong, Hwaseong-si (KR)

(73) Assignee: Samsung Electronics Co., Ltd., Suwon-Si, Gyeonggi-do (KR)

( * ) Notice: Subject to any disclaimer, the term of this patent is extended or adjusted under 35 U.S.C. 154(b) by 0 days.

(21) Appl. No.: 16/183,382

(22) Filed: Nov. 7, 2018

(65) Prior Publication Data
US 2019/0198066 A1 Jun. 27, 2019

(30) Foreign Application Priority Data

Dec. 21, 2017 (KR) .................. 10-2017-0177166
Aug. 30, 2018 (KR) .................. 10-2018-0102451

(51) Int. Cl.
*G11C 7/10* (2006.01)
*G11C 29/50* (2006.01)
*G11C 29/02* (2006.01)

(52) U.S. Cl.
CPC .......... *G11C 7/1048* (2013.01); *G11C 29/022* (2013.01); *G11C 29/028* (2013.01); *G11C 29/50008* (2013.01); *G11C 2207/2254* (2013.01)

(58) Field of Classification Search
None
See application file for complete search history.

(56) References Cited

U.S. PATENT DOCUMENTS

| 5,563,526 | A | * | 10/1996 | Hastings | .................. | H03F 3/72 |
|---|---|---|---|---|---|---|
| | | | | | | 326/37 |
| 6,064,224 | A | * | 5/2000 | Esch, Jr. | ............ | H03K 19/0005 |
| | | | | | | 326/30 |
| 6,570,402 | B2 | | 5/2003 | Koo et al. | | |
| 6,762,620 | B2 | * | 7/2004 | Jang | .................. | H03K 19/0005 |
| | | | | | | 326/27 |
| 7,710,143 | B2 | | 5/2010 | Jeong et al. | | |
| 7,863,927 | B2 | * | 1/2011 | Kinoshita | .......... | H03K 19/0005 |
| | | | | | | 326/30 |
| 7,902,858 | B2 | | 3/2011 | Kuwahara et al. | | |
| 8,040,150 | B2 | * | 10/2011 | Nakatsu | .......... | H03K 19/01750 |
| | | | | | | 326/30 |
| 8,111,084 | B2 | * | 2/2012 | Kim | ...................... | H03H 11/30 |
| | | | | | | 326/26 |

(Continued)

*Primary Examiner* — Minh D A
*Assistant Examiner* — James H Cho
(74) *Attorney, Agent, or Firm* — Lee IP Law, PC

(57) ABSTRACT

A calibration device includes a first comparator that outputs a first result of comparing a level of a first voltage of a first node and a level of a reference voltage, a second comparator that outputs a second result of comparing the level of the first voltage and a level of a second voltage of a second node, and a control signal generator that outputs a first signal for adjusting a first resistance value of a first resistor circuit based on the first result and to output a second signal for adjusting a second resistance value of a second resistor circuit based on the second result. The first node is between the first resistor circuit and a reference resistor, and the second node is between the second resistor circuit and a third resistor circuit which is adjusted to have the same resistance value as the first resistance value.

14 Claims, 15 Drawing Sheets

(56) References Cited

U.S. PATENT DOCUMENTS

| | | |
|---|---|---|
| 9,047,986 B2 | 6/2015 | Fujisawa |
| 2005/0226080 A1* | 10/2005 | Lee .......................... G11O 5/04 365/230.03 |
| 2011/0025373 A1 | 2/2011 | Kim et al. |
| 2011/0133774 A1 | 6/2011 | Kim |
| 2012/0092039 A1* | 4/2012 | Lee .......................... G11C 7/02 326/30 |
| 2015/0067292 A1 | 3/2015 | Grunzke |
| 2015/0117122 A1 | 4/2015 | Lee et al. |
| 2017/0331476 A1* | 11/2017 | Cho .................. H03K 19/0005 |

* cited by examiner

STORAGE DEVICE INCLUDING CALIBRATION DEVICE

CROSS-REFERENCE TO RELATED APPLICATION

Korean Patent Application Nos. 10-2017-0177166 filed on Dec. 21, 2017, and 10-2018-0102451 filed on Aug. 30, 2018 in the Korean Intellectual Property Office, and entitled: "Storage Device Including Calibration Device," are incorporated by reference herein in their entireties.

BACKGROUND

1. Field

Embodiments herein relate to an electronic device, and more particularly, relate to a storage device.

2. Description of the Related Art

As an interface operation of a semiconductor memory device becomes higher, a swing width of a signal exchanged between a memory device and a memory controller gradually decreases. As the swing width of the signal decreases, influence of an external noise on the signal increases. As such, it may be difficult to exchange signals between the memory device and the memory controller at high speed, and data output from the semiconductor memory device may be damaged.

SUMMARY

According to an exemplary embodiment, a calibration device may include a first comparator that outputs a first comparison result of comparing a level of a first voltage of a first node and a level of a reference voltage, a second comparator that outputs a second comparison result of comparing the level of the first voltage and a level of a second voltage of a second node, and a control signal generator that outputs a first control signal for adjusting a first resistance value of a first resistor circuit based on the first comparison result and to output a second control signal for adjusting a second resistance value of a second resistor circuit based on the second comparison result. The first node may be between the first resistor circuit and a reference resistor, and the second node may be between the second resistor circuit and a third resistor circuit, a third resistance value of the third resistor circuit being adjusted to have the same resistance value as the first resistance value.

According to an exemplary embodiment, a calibration device may include a first operational amplifier that outputs a first control signal for adjusting a first resistance value of a first resistor circuit by comparing a level of a first voltage of a first node and a level of a reference voltage, a second operational amplifier that outputs a second control signal for adjusting a second resistance value of a second resistor circuit by comparing the level of the first voltage and a level of a second voltage of a second node. The first node may be between the first resistor circuit and a reference resistor, and the second node may be between the second resistor circuit and a third resistor circuit, a third resistance value of the third resistor circuit being adjusted to have the same resistance value as the first resistance value.

According to an exemplary embodiment, a storage device may include a memory device, and a controller that performs a calibration operation of adjusting a first resistance value of a first resistor circuit based on a first comparison result of comparing a level of a first voltage and a level of a first reference voltage and adjusting a second resistance value of a second resistor circuit based on a second comparison result of comparing the level of the first voltage and a level of a second voltage. The level of the first voltage may be determined based on the first resistance value and a first reference resistance value, and the level of the second voltage may be determined based on the first resistance value and the second resistance value.

BRIEF DESCRIPTION OF THE DRAWINGS

Features will become apparent to those of skill in the art by describing in detail exemplary embodiments with reference to the attached drawings in which.

DETAILED DESCRIPTION

Below, embodiments will be described in detail and clearly to such an extent that those skilled in the art easily implement embodiments set forth herein.

Figure 1:
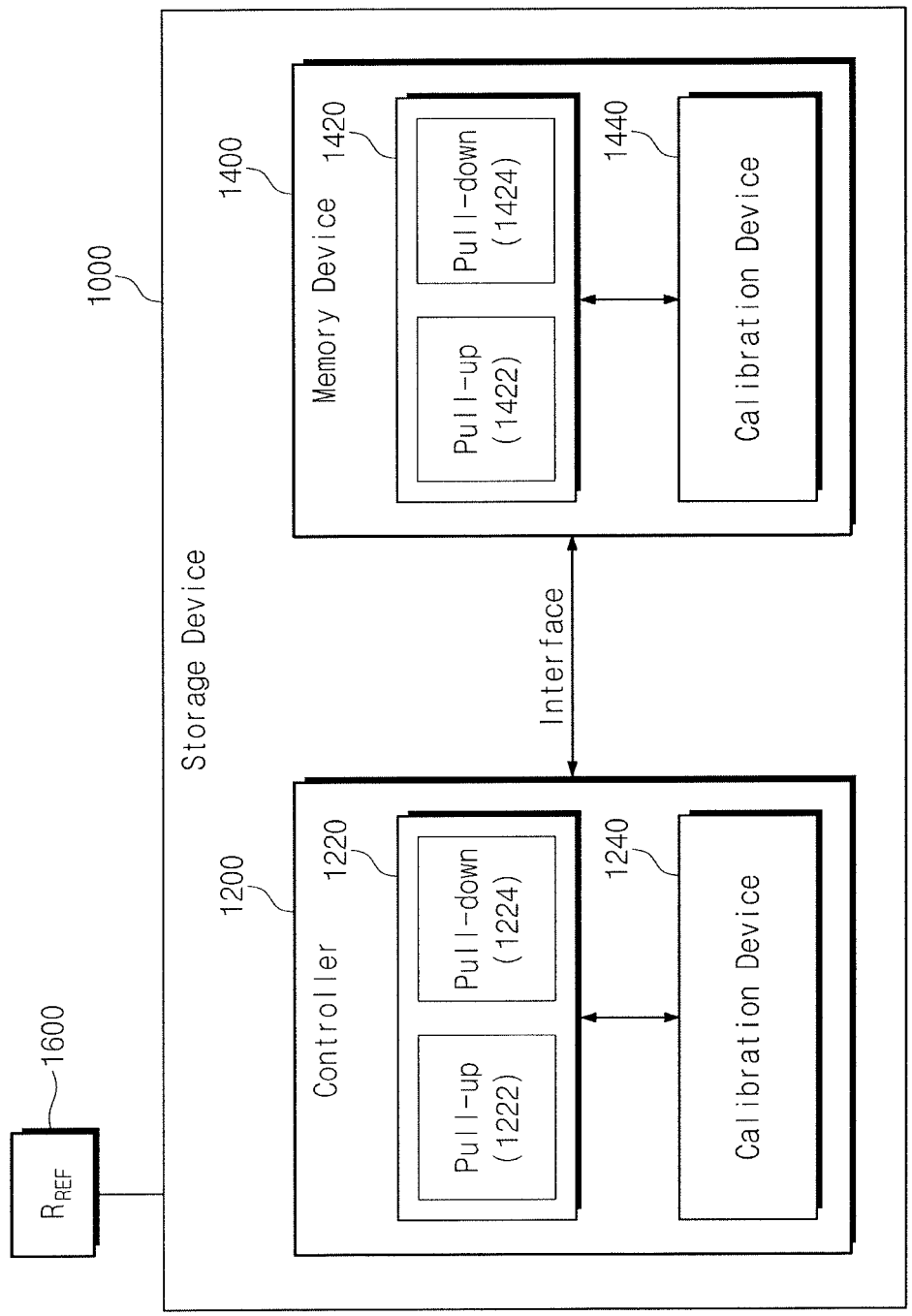
FIG. 1 is a block diagram illustrating a storage device according to an embodiment.

FIG. 1 is a block diagram illustrating a storage device according to an embodiment.

A storage device 1000 may include a controller 1200 and a memory device 1400.

The storage device 1000 may store data, may manage the stored data, and may provide necessary information to a user. According to an embodiment, the storage device 1000 may be a personal computer, or a mobile electronic device such as, but not limited to, a notebook computer, a mobile phone, personal digital assistant (PDA), or a camera.

The controller 1200 may control overall operations of the storage device 1000. For example, the controller 1200 may schedule operations of the memory device 1400 or may encode and decode signals/data processed in the storage device 1000. The controller 1200 may control the memory device 1400 such that the memory device 1400 stores or outputs data. For example, the controller 1200 may perform an interface operation with the memory device 1400 in response to a command received from a host.

The controller 1200 may be connected with the memory device 1400 through a plurality of channels. The controller 1200 may include a hardware and/or software for performing an operation in response to various requests from the host. The controller 1200 according to an embodiment may include a volatile memory, e.g., a dynamic random access memory (DRAM), a static random access memory (SRAM), a synchronous DRAM (SDRAM), and the like.

The controller 1200 may include one or more hardware components (e.g., an analog circuit, a logic circuit, etc.) to perform functions described above and to be described below. Additionally or alternatively, the controller 1200 may include one or more processor cores. Functions of the controller 1200 described above and to be described below may be implemented with a program code of software and/or firmware, and the processor core(s) of the controller 1200 may execute an instruction set of the program code. The processor core(s) of the controller 1200 may process various kinds of arithmetic operations and/or logical operations for the purpose of executing the instruction set.

The memory device 1400 may include at least one non-volatile memory. For example, the memory device 1400 may include a plurality of flash memories. For example, the memory device 1400 may include another type of non-volatile memory such as a phase-change RAM (PRAM), a ferrroelectric RAM (FRAM), a magneto-resistive RAM (MRAM), and the like. The memory device 1400 may store one data bit or two or more data bits per memory cell. The non-volatile memory used to implement the memory device 1400 may include a memory cell array of a three-dimensional structure.

The interface operation between the controller 1200 and the memory device 1400 may be performed based on a digital signal or an analog signal. The controller 1200 may include a driver for the interface operation with the memory device 1400. The memory device 1400 may include a driver for the interface operation with the controller 1200.

For example, the controller 1200 may transmit a digital signal to the memory device 1400, and the memory device 1400 may return a response to the received digital signal to the controller 1200.

For example, the controller 1200 may transmit analog signal to the memory device 1400, and the memory device 1400 may return a response to the received analog signal to the controller 1200. According to an embodiment, the analog signal may be a voltage signal.

When an interface operation between the controller 1200 and the memory device 1400 is performed based on a voltage signal, a level of the voltage signal needs to be maintained at a specific value. When the level of the voltage signal is not exact or changes readily, a speed of the interface operation may decrease, or data that are output from the storage device 1000 or are input to the storage device 1000 may be damaged.

The controller 1200 and the memory device 1400 may include a resistance unit 1220 and a resistance unit 1420, respectively. The resistance unit 1220 and the resistance unit 1420 may be used to adjust a level of a voltage signal transmitted and received between the controller 1200 and the memory device 1400. For example, the level of the voltage signal for the interface operation may be defined by a standard specification of the storage device 1000, but embodiments are not limited thereto.

The resistance unit 1220 of the controller 1200 may include a pull-up circuit 1222 and a pull-down unit 1224. The resistance unit 1420 of the memory device 1400 may include a pull-up circuit 1422 and a pull-down circuit 1424. Each of the pull-up circuit 1222, the pull-down circuit 1224, the pull-up circuit 1422, and the pull-down circuit 1424 may include a circuit. For example, each of the pull-up circuit 1222, the pull-down circuit 1224, the pull-up circuit 1422, and the pull-down circuit 1424 may include a single resistor. Alternatively, each of the pull-up circuit 1222, the pull-down circuit 1224, the pull-up circuit 1422, and the pull-down circuit 1424 may include transistors connected in parallel. Alternatively, each of the pull-up circuit 1222, the pull-down circuit 1224, the pull-up circuit 1422, and the pull-down circuit 1424 may include transistors connected in parallel, and a single resistor. However, the circuit included in each of the pull-up circuit 1222, the pull-down circuit 1224, the pull-up circuit 1422, and the pull-down circuit 1424 may include circuit element.

A resistance value of each of the pull-up circuit 1222, the pull-down circuit 1224, the pull-up circuit 1422, and the pull-down circuit 1424 may mean a resistance value of all direct current circuits included in each of the pull-up circuit 1222, the pull-down circuit 1224, the pull-up circuit 1422, and the pull-down circuit 1424, or an impedance value of all alternate current circuits included therein.

According to an embodiment, in the case where the controller 1200 transmits a voltage signal to the memory device 1400, a level of the voltage signal may be adjusted by the pull-up circuit 1222 and the pull-down circuit 1424. According to an embodiment, in the case of transmitting a voltage signal from the memory device 1400 to the controller 1200, a level of the voltage signal may be adjusted by the pull-up circuit 1422 and the pull-down circuit 1224.

A resistance value of each of the pull-up circuit 1222, the pull-down circuit 1224, the pull-up circuit 1422, and the pull-down circuit 1424 may vary with a process, voltage, and temperature (PVT) condition. In this case, a level of a voltage signal which is used in an interface operation between the controller 1200 and the memory device 1400 may not be exactly adjusted.

To adjust a level of a voltage signal, the controller 1200 and the memory device 1400 may include a calibration device 1240 and a calibration device 1440, respectively. The controller 1200 may include the calibration device 1240 for performing a calibration operation of adjusting the resistance values of the pull-up circuit 1222 and the pull-down circuit 1224. The memory device 1400 may include the calibration device 1440 for performing a calibration operation of adjusting the resistance values of the pull-up circuit 1422 and the pull-down circuit 1424. The calibration device 1240 and the calibration device 1440 may perform the calibration operation by using a reference resistor 1600 connected to the storage device 1000. According to an embodiment, the storage device 1000 may include a terminal for connection with the reference resistor 1600. The terminal may be implemented, but is not limit to, in the form of a pin or a pad.

Figure 2:
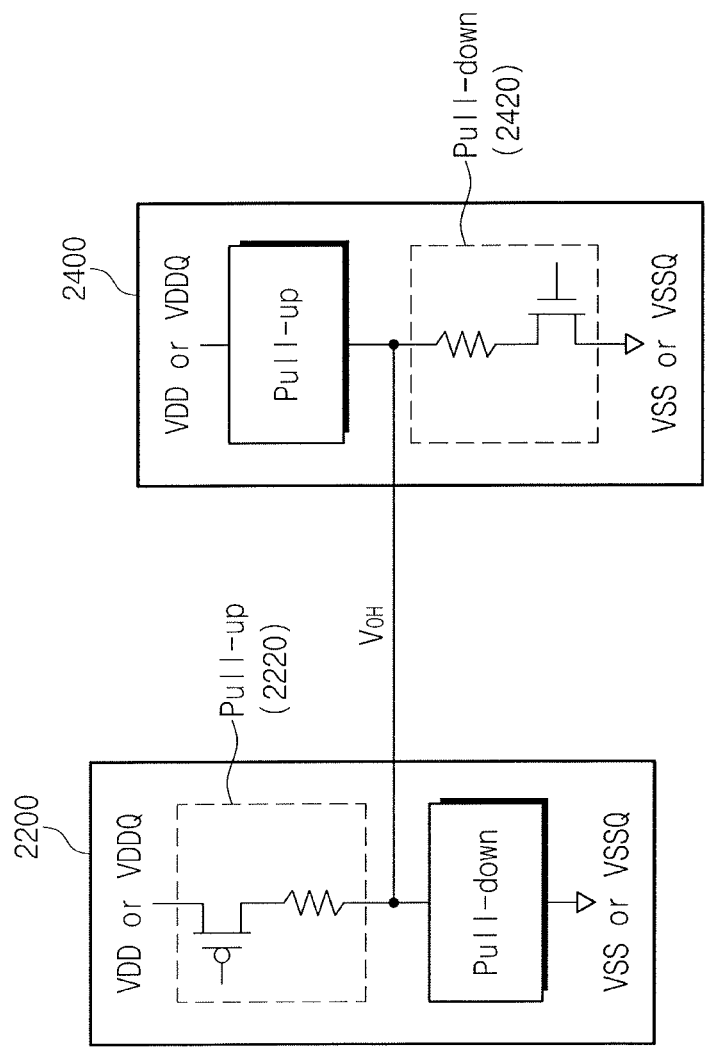
FIG. 2 is a conceptual diagram illustrating a transmitter and a receiver performing an interface operation based on a voltage signal according to an embodiment.

FIG. 2 is a conceptual diagram illustrating a transmitter and a receiver performing an interface operation based on a voltage signal, according to an embodiment.

Referring to FIG. 1, in the case where the controller 1200 transmits a voltage signal to the memory device 1400, a transmitter 2200 and a receiver 2400 may indicate the controller 1200 and the memory device 1400, respectively. In the case where the memory device 1400 transmits a voltage signal to the controller 1200, the transmitter 2200 and the receiver 2400 may indicate the memory device 1400 and the controller 1200, respectively.

The transmitter 2200 may output $V_{OH}$ being a voltage signal to the receiver 2400. $V_{OH}$ according to an embodiment may be supplied from a power supply voltage. The power supply voltage may be a power supply voltage VDD/VSS or a power supply voltage VDDQ/VSSQ supplied from an external device of the storage device 1000. The transmitter 2200 and the receiver 2400 may perform the calibration operation by using the power supply voltage VDD/VSS or the power supply voltage VDDQ/VSSQ. The power supply voltage VDD/VSS may be a power supply voltage necessary for the components 1200 and 1400 of the storage device 1000 to operate. The power supply voltage VDDQ/VSSQ may be a power supply voltage necessary for the components 1200 and 1400 of the storage device 1000 to output data. Levels of the power supply voltages VDD and VDDQ may be higher than levels of the power supply voltages VSS and VSSQ, respectively. However, the embodiments are not limited to the supplied power supply voltages. Also, in the following descriptions, VDD and VSS may be replaced with VDDQ and VSSQ, respectively.

In the case where the transmitter 2200 outputs $V_{OH}$ being a voltage signal to the receiver 2400, a level of $V_{OH}$ may be determined depending on a resistance value of a pull-up circuit 2220 and a resistance value of a pull-down circuit 2420. For example, "$V_{OH}$" may be determined depending on Equation 1.

$$V_{OH} = VSS + (VDD - VSS) \times \frac{R_{pull\text{-}down}}{(R_{pull\text{-}up} + R_{pull\text{-}down})} \quad \text{[Equation 1]}$$

Where $R_{pull\text{-}up}$ is a resistance value of the pull-up circuit 2220 and $R_{pull\text{-}down}$ is a resistance value of the pull-down circuit 2420.

Each of the pull-up circuit 2220 and the pull-down circuit 2420 according to an embodiment may include at least one transistor. For example, each of the pull-up circuit 2220 and the pull-down circuit 2420 may include a plurality of transistors connected in parallel. Alternatively, each of the pull-up circuit 2220 and the pull-down circuit 2420 may include, but is not limited to, a resistor in addition to the transistor(s).

The level of $V_{OH}$ which is a voltage signal may be exactly adjusted through the calibration operation according to an embodiment. Calibration operations according to an embodiment will be described with reference to FIGS. 3 to 14.

Figure 3:
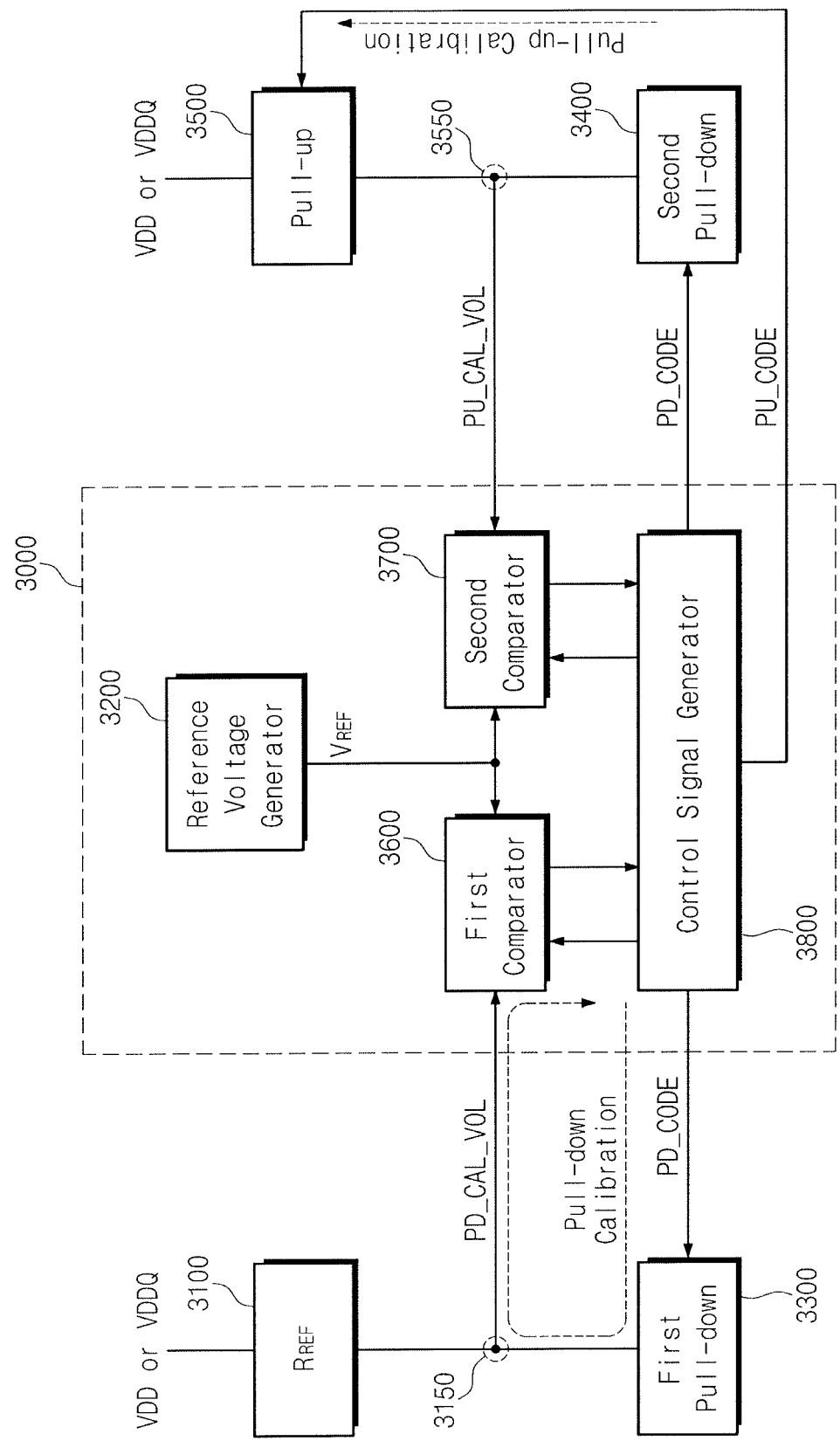
FIG. 3 is a block diagram illustrating a calibration device according to an embodiment.

FIG. 3 is a block diagram illustrating a calibration device according to an embodiment.

A calibration device 3000 may be either the calibration device 1240 or the calibration device 1440 of FIG. 1. The calibration device 3000 may include a reference voltage generator 3200, a first comparator 3600, a second comparator 3700, and a control signal generator 3800. The calibration device 3000 may perform a calibration operation for adjusting resistance values of a first pull-down circuit 3300, a second pull-down circuit 3400, and a pull-up circuit 3500.

The second pull-down circuit 3400 may include the same circuit as a circuit included in the first pull-down circuit 3300, and may receive the same control signal as that the first pull-down circuit 3300 receives. Accordingly, the second pull-down circuit 3400 may be calibrated to have the same resistance value as the resistance value of the first pull-down circuit 3300. The first pull-down circuit 3300 and the second pull-down circuit 3400 may be included in the pull-down circuit 1224 of FIG. 1. Alternatively, the first pull-down circuit 3300 and the second pull-down circuit 3400 may be included in the pull-down circuit 1424 of FIG. 1. The second pull-down circuit 3400 may be used for a calibration operation of the pull-up circuit 3500. This will be described later.

The pull-up circuit 3500 may be included in the pull-up circuit 1222 or the pull-up circuit 1422 of FIG. 1.

A reference resistor 3100 may be used to adjust the resistance values of the first pull-down circuit 3300, the second pull-down circuit 3400, and the pull-up circuit 3500. According to an embodiment, the reference resistor 3100 may correspond to the reference resistor 1600 of FIG. 1.

The reference voltage generator 3200 may output a reference voltage $V_{REF}$ used in the calibration operation. According to an embodiment, a level of the reference voltage $V_{REF}$ output from the reference voltage generator 3200 may be half a level of the power supply voltage $V_{DD}$.

A pull-down calibration operation will be described below. First, the first comparator 3600 may compare a level of the reference voltage $V_{REF}$ output from the reference voltage generator 3200 and a level of "PD_CAL_VOL" output from a node 3150 and may output the comparison result to the control signal generator 3800. The first comparator 3600 according to an embodiment may be implemented with an operational amplifier, but the embodiments are not limited thereto.

"PD_CAL_VOL" according to an embodiment is a voltage of the node 3150 placed between the reference resistor 3100 and the first pull-down circuit 3300. "PD_CAL_VOL" may be supplied from the power supply voltage $V_{DD}$, and a level of "PD_CAL_VOL" may be determined based on a value of the reference resistor 3100 and a resistance value of the first pull-down circuit 3300. For example, "PD_CAL_VOL" may be determined depending on Equation 2.

$$PD\_CAL\_VOL = VSS + (VDD - VSS) \times \frac{R_{pull\text{-}down\_1}}{(R_{REF} + R_{pull\text{-}down\_1})} \quad \text{[Equation 2]}$$

Where $R_{pull\text{-}down\_1}$ is a resistance value of the first pull-down circuit 3300 and $R_{REF}$ is a value of the reference resistor 3100.

Accordingly, "PD_CAL_VOL" may also vary as the resistance value of the first pull-down circuit 3300 varies.

A first comparison result may include information about whether a level of "PD_CAL_VOL" is the same as a level of the reference voltage $V_{REF}$. Also, if the level of "PD_CAL_VOL" and the level of the reference voltage $V_{REF}$ are different, the first comparison result may include information about whether the level of "PD_CAL_VOL" is higher than or lower than the level of the reference voltage $V_{REF}$. According to an embodiment, the first comparison result may include a bit value. For example, if the level of "PD_CAL_VOL" and the level of the reference voltage $V_{REF}$ are the same, the first comparator 3600 may output a bit value of "1" to the control signal generator 3800. If the level of "PD_CAL_VOL" and the level of the reference voltage $V_{REF}$ are different, the first comparator 3600 may output a bit value of "0" to the control signal generator 3800.

The control signal generator 3800 may output a control signal PD_CODE for adjusting the resistance value of the first pull-down circuit 3300 to the first pull-down circuit 3300 based on the first comparison result received. The control signal generator 3800 according to an embodiment may be an application specific integrated circuit (ASIC), an embedded processor, a microprocessor, hardware control logic, a hardware finite state machine (FSM), or a combination thereof. An operation in which the resistance value of the first pull-down circuit 3300 is adjusted based on a control signal PD_CODE will be more fully described with reference to FIG. 6.

A level of "PD_CAL_VOL" may be changed as the resistance value of the first pull-down circuit 3300 is adjusted, and "PD_CAL_VOL" having the changed level and the reference voltage $V_{REF}$ may again be input to the first comparator 3600 The first comparator 3600 may compare the changed level of "PD_CAL_VOL" and the reference voltage $V_{REF}$ and may output the first comparison result to the control signal generator 3800.

The above-described operation may be repeated until the level of "PD_CAL_VOL" is the same as the level of the reference voltage $V_{REF}$. For example, if the first comparison result received by the control signal generator 3800 indicates that the level of "PD_CAL_VOL" is the same as the level of the reference voltage $V_{REF}$, the control signal generator 3800 may stop outputting the control signal PD_CODE to the first pull-down circuit 3300. According to an embodiment, the control signal generator 3800 may determine that the first pull-down circuit 3300 is completely calibrated and may output, to the first comparator 3600, a control signal providing notification that there is no need to perform additional comparison operations.

According to an embodiment, if a level of the reference voltage $V_{REF}$ is set to half level of the power supply voltage $V_{DD}$, a resistance value of the first pull-down circuit 3300 at a time when the first pull-down circuit 3300 is completely calibrated may be the same as a value of the reference resistor 3100.

The control signal generator 3800 may also output the control signal PD_CODE to the second pull-down circuit 3400. The second pull-down circuit 3400 that receives the control signal PD_CODE may be calibrated to have the same resistance value as the resistance value of the first pull-down circuit 3300. The second pull-down circuit 3400 that is completely calibrated may be used for a pull-up calibration operation for adjusting the resistance value of the pull-up circuit 3500.

A pull-up calibration operation will be described below. First, the second comparator 3700 may compare a level of the reference voltage $V_{REF}$ output from the reference voltage generator 3200 and a level of "PU_CAL_VOL" output from a node 3550 and may output a second comparison result to the control signal generator 3800. The second comparator 3700 according to an embodiment may be implemented with an operational amplifier, but embodiments are not limited thereto.

"PU_CAL_VOL" is a voltage of the node 3550 placed between the pull-up circuit 3500 and the second pull-down circuit 3400. "PU_CAL_VOL" may be supplied from the power supply voltage $V_{DD}$. A level of "PU_CAL_VOL" may be determined depending on a resistance value of the pull-up circuit 3500 and a resistance value of the second pull-down circuit 3400. For example, a level of "PU_CAL_VOL" may be determined depending on Equation 3.

$$PU\_CAL\_VOL = VSS + (VDD - VSS) \times \frac{R_{pull-down\_2}}{(R_{pull-up} + R_{pull-down\_2})} \quad \text{[Equation 3]}$$

Where $R_{pull-down\_2}$ is a resistance value of the second pull-down circuit 3400 completely calibrated and $R_{pull-up}$ is a resistance value of the pull-up circuit 3500.

As understood from Equation 3, "PU_CAL_VOL" may vary as the resistance value of the pull-up circuit 3500 varies.

The control signal generator 3800 may provide a control signal PU_CODE to the pull-up circuit 3500, based on the second comparison result received from the second comparator 3700. The resistance value of the pull-up circuit 3500 may be adjusted by the control signal PU_CODE received from the control signal generator 3800. The level of "PU_CAL_VOL" may be changed as the resistance value of the pull-up circuit 3500 is adjusted, and "PU_CAL_VOL" having the changed level and the reference voltage $V_{REF}$ may again be input to the second comparator 3700. The second comparator 3700 may compare the changed level of "PU_CAL_VOL" and the level of the reference voltage $V_{REF}$, and may output the second comparison result to the control signal generator 3800.

The above-described operation may be repeated until a level of "PU_CAL_VOL" is the same as a level of the reference voltage $V_{REF}$. For example, if the second comparison result received by the control signal generator 3800 indicates that the level of "PU_CAL_VOL" is the same as the level of the reference voltage $V_{REF}$, the control signal generator 3800 may stop outputting the control signal PU_CODE to the pull-up circuit 3500. According to an embodiment, the control signal generator 3800 may determine that the pull-up circuit 3500 is completely calibrated and may output, to the second comparator 3700, a control signal providing notification that there is no need to perform additional comparison operations.

According to an embodiment, if the level of the reference voltage $V_{REF}$ is set half the level of the power supply voltage $V_{DD}$, the resistance value of the pull-up circuit 3500 at a time when the pull-up circuit 3500 is completely calibrated may be the same as the resistance value of the second pull-down circuit 3400.

According to the embodiment described with reference to FIG. 3, after the first pull-down circuit 3300 and the second pull-down circuit 3400 are completely calibrated, the calibration device 3000 may start the calibration operation for the pull-up circuit 3500 by using the second pull-down circuit 3400. Accordingly, the total time taken to complete the pull-down calibration operation and the pull-up calibration operation may correspond to a sum of a time taken for the pull-down calibration operation and a time taken for the pull-up calibration operation. Also, since the resistance value of the pull-up circuit 3500 is adjusted based on the resistance value of the second pull-down circuit 3400, in the case where the resistance value of the second pull-down circuit 3400 is not exactly adjusted, the resistance value of the pull-up circuit 3500 may not be exactly adjusted.

As illustrated in FIG. 3, in the case where the reference resistor 3100 is placed between the node 3150 and a node to which the power supply voltage VDD is supplied, the first pull-down circuit 3300, the second pull-down circuit 3400, and the pull-up circuit 3500 may be placed between the node 3150 and a node to which the power supply voltage VSS is supplied, between the node 3550 and the node to which the power supply voltage VSS is supplied, and between the node 3550 and the node to which the power supply voltage VDD is supplied, respectively. A calibration operation which is performed in the case where the reference resistor 3100 is placed between the node 3150 and the node to which the power supply voltage VDD is supplied will be more fully described with reference to FIGS. 4 to 9. The node which supplies the power supply voltage VSS to the first pull-down circuit 3300 may be the same as or different from the node which supplies the power supply voltage VSS to the second pull-down circuit 3400. The node which supplies the power supply voltage VDD to the reference resistor 3100 may be the same as or different from the node which supplies the power supply voltage VDD to the pull-up circuit 3500.

Figure 4:
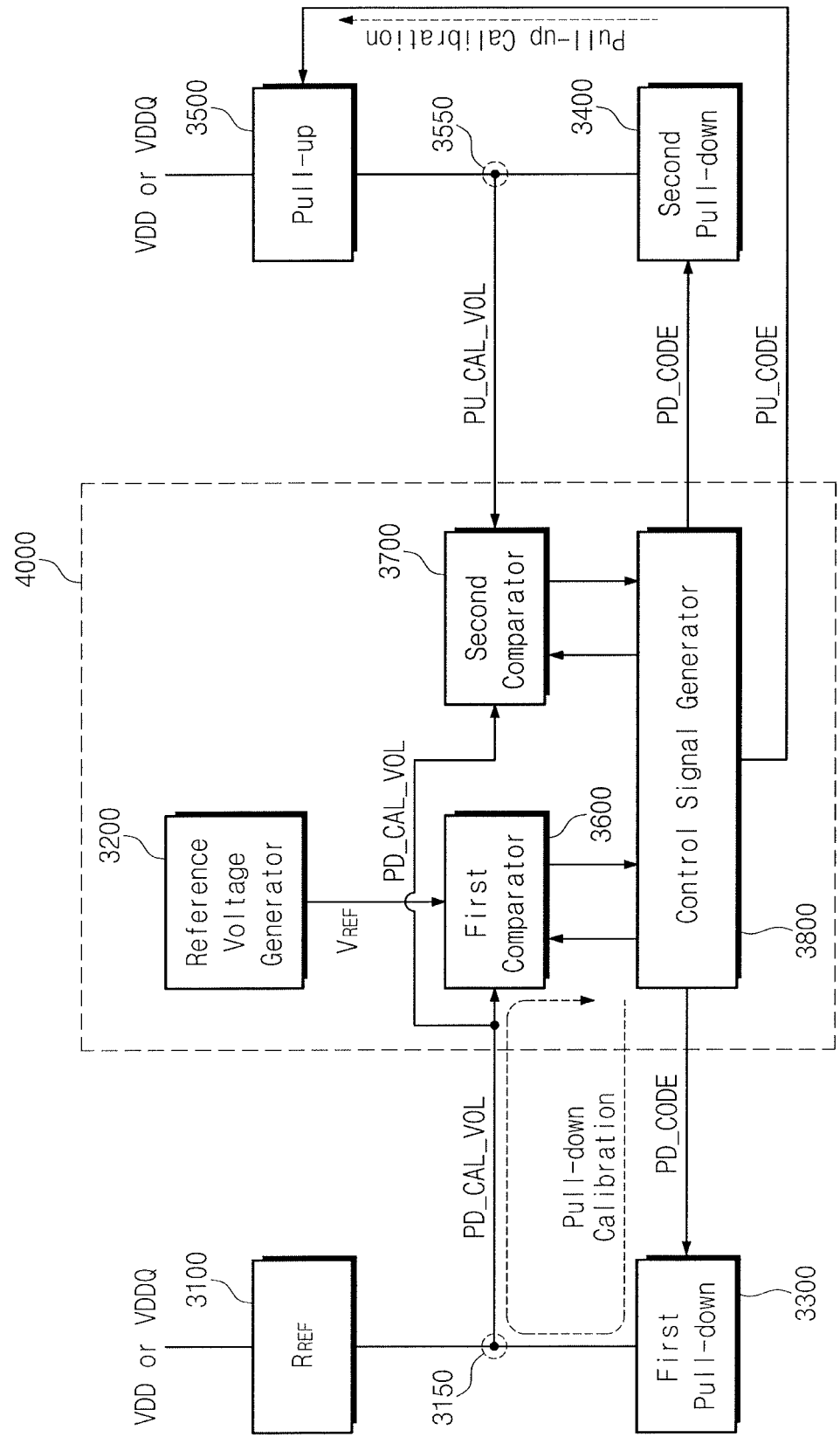
FIG. 4 is a block diagram illustrating a calibration device according to an embodiment.

FIG. 4 is a block diagram illustrating a calibration device according to an embodiment.

Components illustrated in FIG. 4 may provide operations corresponding to the components illustrated in FIG. 3. Thus, additional description will be omitted to avoid redundancy.

A calibration device 4000 of FIG. 4 is different from the calibration device 3000 of FIG. 3 in that the second comparator 3700 receives "PD_CAL_VOL" and "PU_CAL_VOL" instead of the reference voltage $V_{REF}$ and "PU_CAL_VOL". As such, the calibration device 4000 may perform the pull-down calibration operation and the pull-up calibration operation in parallel or at the same time. e.g., simultaneously. Accordingly, a total time taken to perform the calibration operation may decrease.

In detail, as described with reference to FIG. 3, "PD_CAL_VOL" is determined depending on Equation 2, and "PU_CAL_VOL" is determined depending on Equation 3. Since the resistance value of the first pull-down circuit 3300 is the same as the resistance value of the second pull-down circuit 3400, a value of $R_{pull-down\_1}$ of Equation 2 is the same as a value of $R_{pull-down\_2}$ of Equation 3. Accordingly, whether "PD_CAL_VOL" and "PU_CAL_VOL" input to the second comparator 3700 are the same as each other may be determined only based on whether the resistance value ($R_{pull-up}$ of Equation 3) of the pull-up circuit 3500 is the same as the resistance value ($R_{REF}$ of Equation 2) of the reference resistor 3100. That is, since the pull-up calibration operation does not depend on the resistance value of the second pull-down circuit 3400, there is no need to perform the pull-up calibration operation after the pull-down calibration operation is completed.

The second comparator 3700 may output a comparison result of a level of "PD_CAL_VOL" and a level of "PU_CAL_VOL" to the control signal generator 3800, and the control signal generator 3800 may output the control signal PU_CODE to the pull-up circuit 3500 based on the comparison result received from the second comparator 3700. If the comparison result received by the control signal generator 3800 indicates that the level of "PU_CAL_VOL" is the same as the level of the reference voltage $V_{REF}$, the control signal generator 3800 may stop outputting the control signal PU_CODE to the pull-up circuit 3500. According to an embodiment, the control signal generator 3800 may determine that the pull-up circuit 3500 is completely calibrated and may output, to the second comparator 3700, a control signal providing notification that there no additional comparison operations are needed. The resistance value of the pull-up circuit 3500 at a time when the pull-up circuit 3500 is completely calibrated may be the same as the resistance value of the reference resistor 3100.

The calibration device 4000 according to an embodiment may perform the calibration operation including the pull-down calibration operation and the pull-up calibration operation based on a reference period. For example, the calibration device 4000 may perform the calibration operation in response to a calibration enable signal periodically received from the storage device 1000 of FIG. 1. For example, the calibration device 4000 may perform the calibration operation at a time T1 and may again perform the calibration operation at a time T2. According to an embodiment, the calibration device 4000 may start a new calibration operation based on a state of the pull-down circuit 3300 or the pull-up circuit 3500 at a time when a previous calibration operation is completed, but embodiments are not limited thereto.

Figure 5:
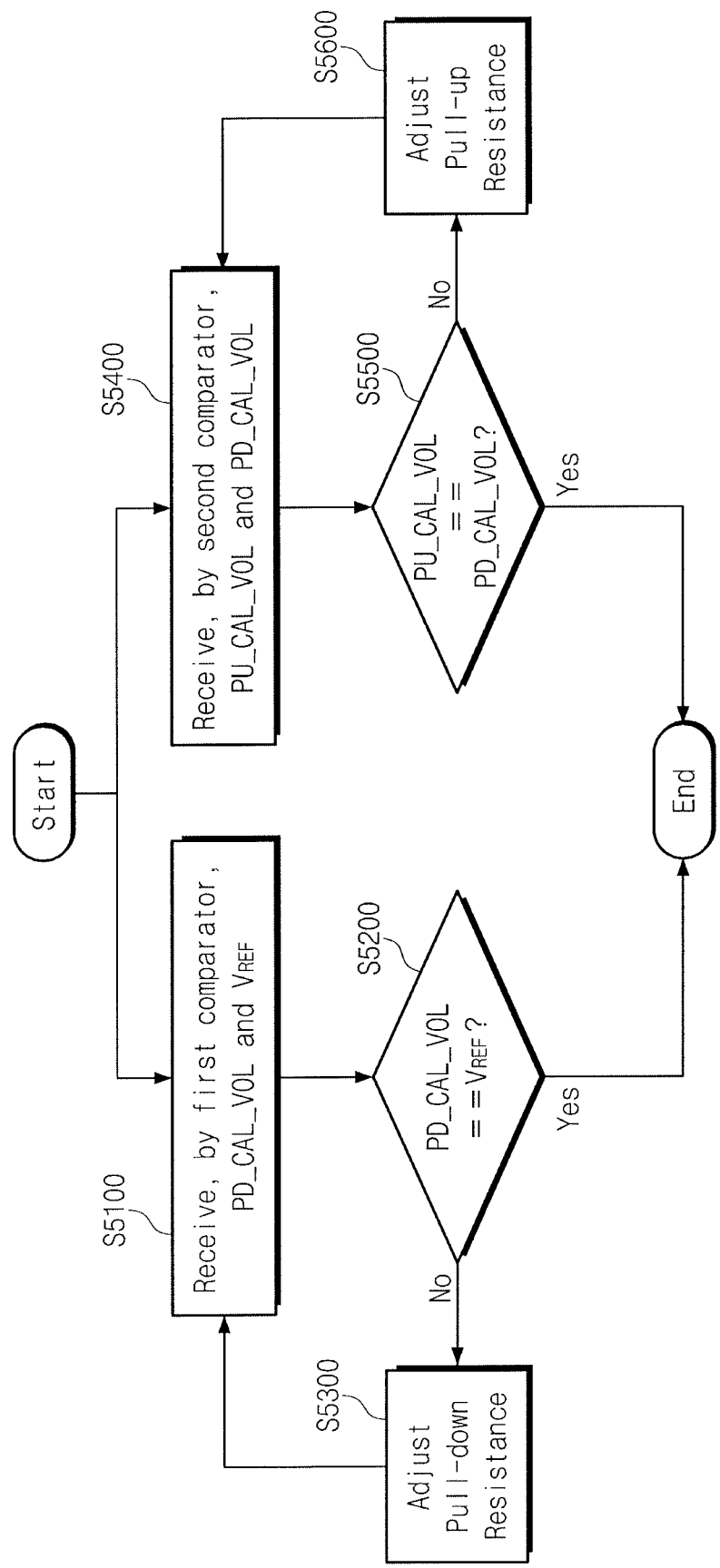
FIG. 5 is a flowchart illustrating a method in which a calibration device of FIG. 4 performs a calibration operation.

FIG. 5 is a flowchart illustrating a method in which a calibration device of FIG. 4 performs a calibration operation.

In operation S5100, a first comparator 3600 may receive "PD_CAL_VOL" and the reference voltage $V_{REF}$.

In operation S5200, the first comparator 3600 may compare a level of "PD_CAL_VOL" and a level of the reference voltage $V_{REF}$.

In the case where the level of "PD_CAL_VOL" is different from the level of the reference voltage $V_{REF}$, in operation S5300, the control signal generator 3800 may adjust the resistance value of the first pull-down circuit 3300. The level of "PD_CAL_VOL" may be changed as the resistance value of the first pull-down circuit 3300 is adjusted, and the changed level of "PD_CAL_VOL" may be again compared with the reference voltage $V_{REF}$ in operation S5100.

In the case where the resistance value of the first pull-down circuit 3300 is the same as the value of the reference resistor 3100, the level of "PD_CAL_VOL" may be the same as the level of the reference voltage $V_{REF}$. If the level of "PD_CAL_VOL" is the same as the level of the reference voltage $V_{REF}$, the pull-down calibration operation may be terminated.

In operation S5400, a second comparator 3700 may receive "PD_CAL_VOL" and "PU_CAL_VOL". "PD_CAL_VOL" may be supplied from the power supply voltage $V_{DD}$ of a storage device, and the level of "PD_CAL_VOL" may be determined depending on the value of the reference resistor and the resistance value of the pull-down circuit.

In operation S5500, the second comparator 3700 may compare "PD_CAL_VOL" and "PU_CAL_VOL".

If the level of "PD_CAL_VOL" is different from the level of "PU_CAL_VOL", in operation S5600, the resistance value of the pull-up circuit may be adjusted. The level of "PU_CAL_VOL" may be changed as the resistance value of the pull-up circuit 3500 is adjusted, and the changed level of "PU_CAL_VOL" may be again compared with the level of "PD_CAL_VOL" in operation S5400.

In the case where the resistance value of the pull-up circuit 3500 is the same as the resistance value of the second pull-down circuit 3400, the level of "PD_CAL_VOL" may be the same as the level of "PU_CAL_VOL". If "PD_CAL_VOL" is the same as "PU_CAL_VOL", the pull-up calibration operation may be terminated. That is, in the case where the resistance values of the pull-up circuit 3500 and the pull-down circuits 3300 and 3400 are the same as the value of the reference resistor 3100, the calibration operation including the pull-up calibration operation and the pull-down calibration operation may be terminated.

The pull-down calibration operation that is performed by repeating operation S5100, operation S5200, and operation S5300 and the pull-up calibration operation that is performed by repeating operation S5400, operation S5500, and operation S5600 may be independent of each other. Accordingly, a time taken to perform the calibration operation may be shortened compared with the case where the pull-up calibration operation is performed after the pull-down calibration operation is performed.

Figure 6:
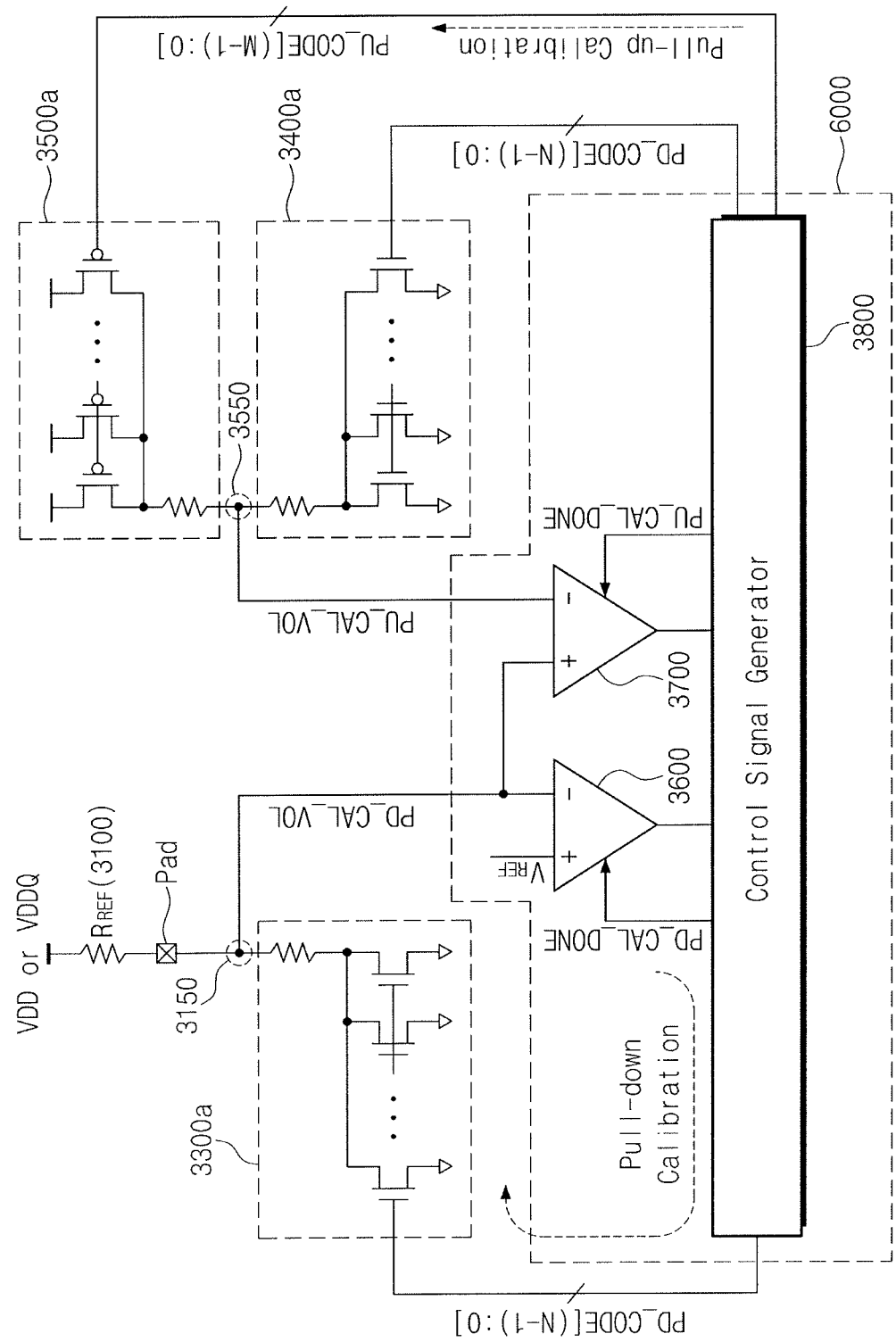
FIG. 6 is a circuit diagram illustrating an exemplary configuration of a calibration device of FIG. 4.

FIG. 6 is a circuit diagram illustrating an exemplary configuration of a calibration device of FIG. 4.

Components illustrated in FIG. 6 may provide operations corresponding to the components illustrated in FIG. 4. Thus, additional description will be omitted to avoid redundancy.

A calibration device 6000 may perform a calibration operation for adjusting resistance values of a first pull-down circuit 3300a, a second pull-down circuit 3400a, and a pull-up circuit 3500a by using the reference resistor 3100 connected with through a pad.

Each of the first pull-down circuit 3300a and the second pull-down circuit 3400a may include "N" transistors (N being a positive integer) connected in parallel and a single resistor. Also, the pull-up circuit 3500a may include "M" transistors (M being a positive integer) connected in parallel and a single resistor.

In the case where the reference resistor 3100 is placed between the node 3150 and the node to which the power supply voltage VDD is supplied, each of the "N" transistors included in each of the first pull-down circuit 3300a and the second pull-down circuit 3400a may be an NMOS transistor. In this case, a source terminal of an NMOS transistor may be connected to the node to which the power supply voltage VSS is supplied. Also, each of the "M" transistors included in the pull-up circuit 3500a may be a PMOS transistor. In this case, a source terminal of a PMOS transistor may be connected to the node to which the power supply voltage VDD is supplied.

The first comparator 3600 may compare a level of "PD_CAL_VOL" and a level of the reference voltage $V_{REF}$ and may output a first comparison result to the control signal generator 3800.

The control signal generator 3800 may output a control signal PD_CODE[(N−1):0] for turning on or turning off the respective transistors included in the first pull-down circuit 3300a and the second pull-down circuit 3400a, based on the first comparison result thus received. A resistance value of the first pull-down circuit 3300a may be adjusted depending on the number of transistors, which are turned on, from among the plurality of transistors connected in parallel. For example, the resistance value of the first pull-down circuit 3300a may decrease as the number of transistors turned on increases.

According to an embodiment, the control signal PD_CODE[(N−1):0] may be a bit string including "N" bits. Here, "N" may indicate the number of transistors included in the first pull-down circuit 3300a. For example, in the case where the first pull-down circuit 3300a includes three transistors connected in parallel, the control signal generator 3800 may output the control signal PD_CODE[2:0] including a bit string of "101". In the case where the first pull-down circuit 3300a includes NMOS transistors, in response to the control signal PD_CODE[2:0], a first transistor and a third transistor of the first pull-down circuit 3300a may be turned on, and a second transistor thereof may be turned off.

The second comparator 3700 may compare the level of "PD_CAL_VOL" and the level of "PU_CAL_VOL" and may output a second comparison result to the control signal generator 3800. The control signal generator 3800 may output, to the pull-up circuit 3500a, a control signal PU_CO-DE[(M−1):0] for turning on or turning off the respective transistors included in the pull-up circuit 3500a, based on the second comparison result thus received. The control signal PU_CODE[(M−1):0] may be a bit string including "M" bits. For example, in the case where the pull-up circuit 3500a includes three transistors connected in parallel, the control signal generator 3800 may output a control signal PU_CODE[2:0] including a bit string of "101". In the case where the pull-up circuit 3500a includes PMOS transistors, in response to the control signal PU_CODE[2:0], a first transistor and a third transistor of the pull-up circuit 3500a may be turned off, and a second transistor thereof may be turned on.

If the pull-down calibration operation is completed, the control signal generator 3800 may output a control signal PD_CAL_DONE to the first comparator 3600. The first comparator 3600 which receives the control signal PD_CAL_DONE from the control signal generator 3800 may stop comparing the reference voltage $V_{REF}$ and "PD_CAL_VOL".

If the pull-up calibration operation is completed, the control signal generator 3800 may output a control signal PU_CAL_DONE to the second comparator 3700. The second comparator 3700 which receives the control signal PU_CAL_DONE from the control signal generator 3800 may stop comparing "PD_CAL_VOL" and "PU_CAL_VOL".

Figure 7:
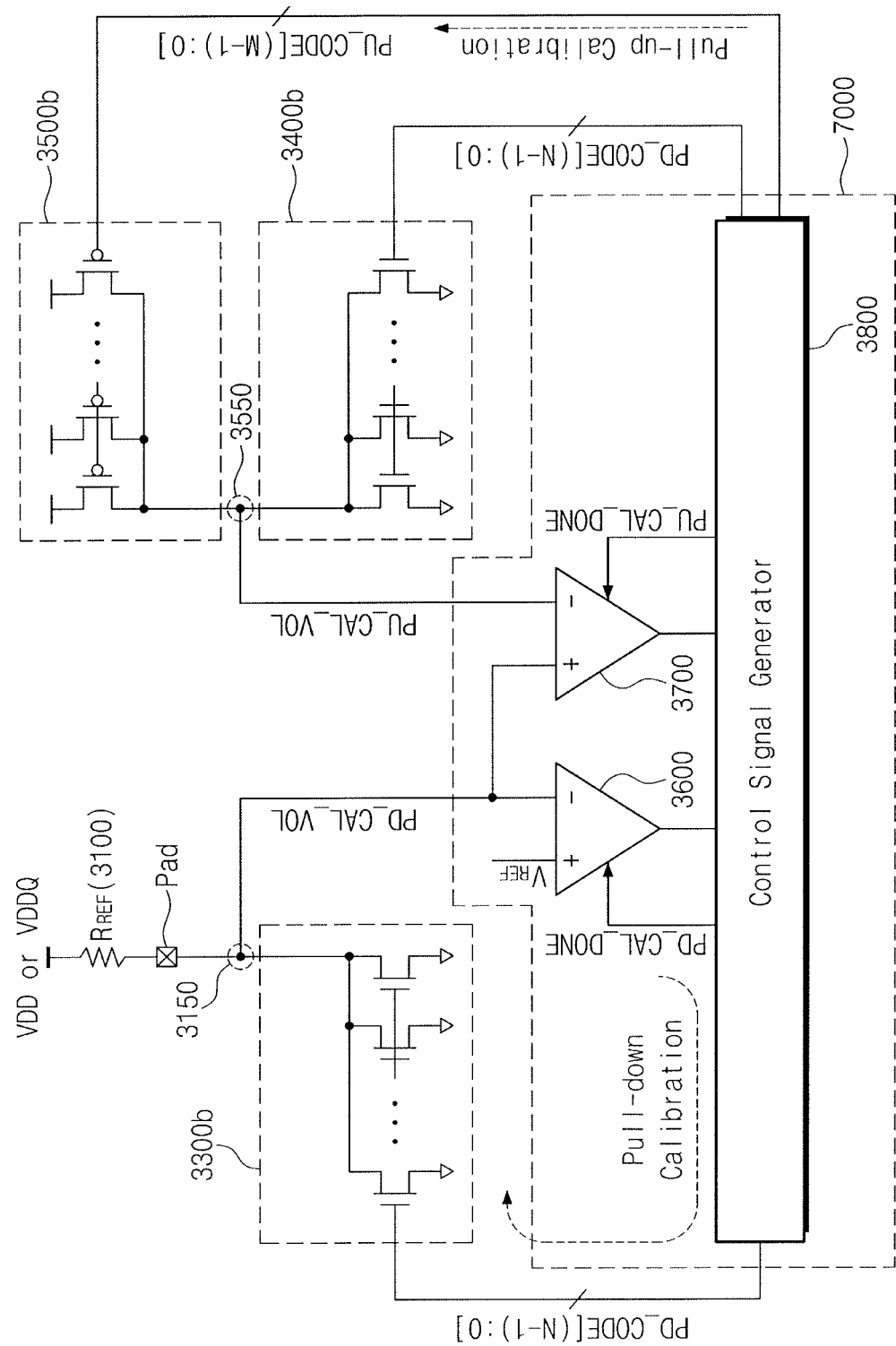
FIG. 7 is a circuit diagram illustrating an exemplary configuration of a calibration device of FIG. 4.

FIG. 7 is a circuit diagram illustrating an exemplary configuration of a calibration device of FIG. 4.

Components illustrated in FIG. 7 may provide operations corresponding to the components illustrated in FIG. 6.

A first pull-down circuit 3300b and a second pull-down circuit 3400b of FIG. 7 are different from the first pull-down circuit 3300a and the second pull-down circuit 3400a of FIG. 6 in that the first pull-down circuit 3300b and the second pull-down circuit 3400b do not include a resistor. That is, each of the first pull-down circuit 3300b and the second pull-down circuit 3400b may include only "N" transistors (N being a positive integer) connected in parallel.

Unlike the pull-up circuit 3500a, a pull-up circuit 3500b may not include a resistor. That is, the pull-up circuit 3500b may include only "M" transistors (M being a positive integer) connected in parallel.

A calibration operation to be performed by components illustrated in FIG. 7 is substantially the same as the calibration operation described with reference to FIG. 6, and thus, additional description will be omitted to avoid redundancy.

Figure 8:
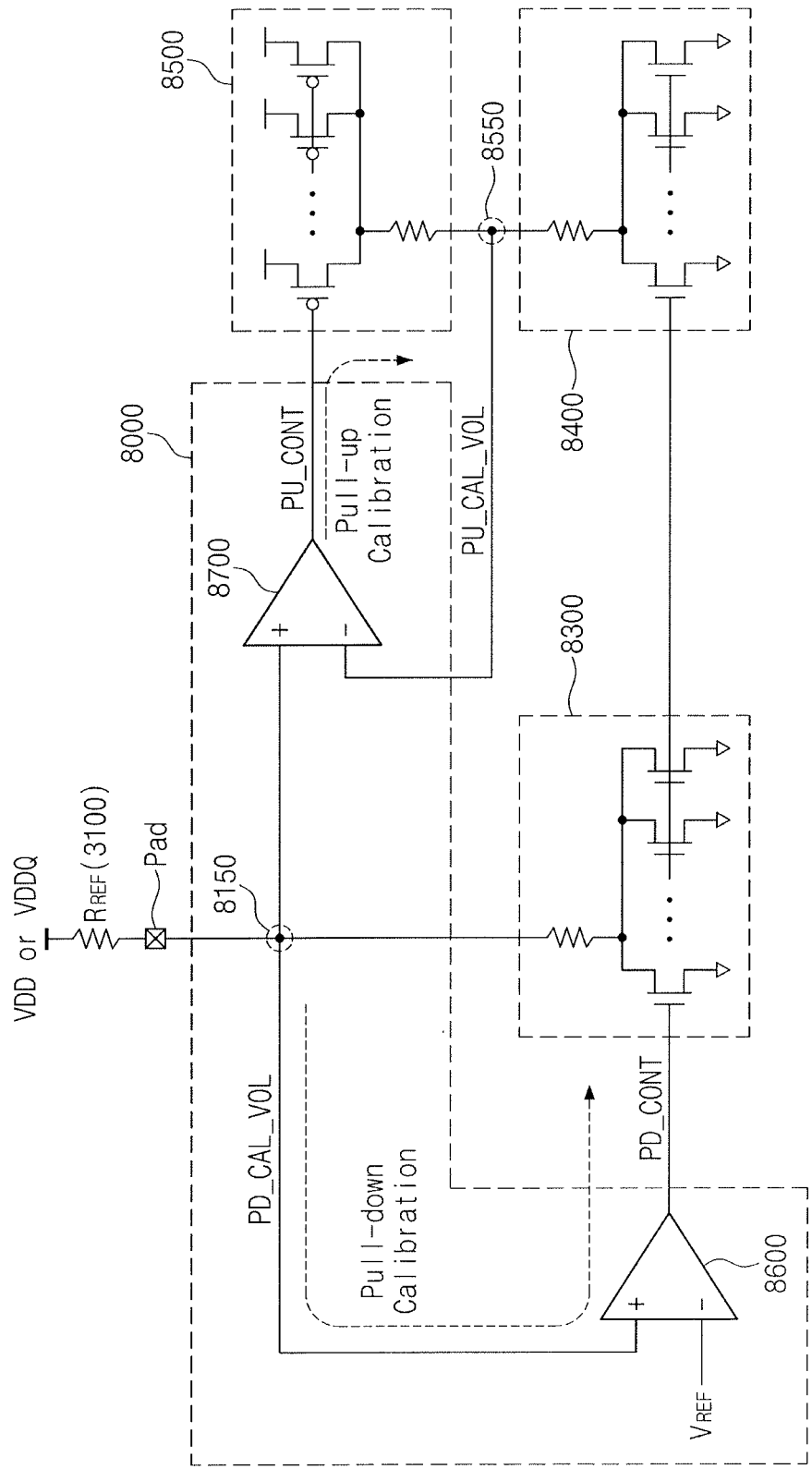
FIG. 8 is a circuit diagram illustrating a calibration device according to an embodiment.

FIG. 8 is a circuit diagram illustrating a calibration device according to an embodiment.

A first pull-down circuit 8300, a second pull-down circuit 8400, and a pull-up circuit 8500 of FIG. 8 may be substantially the same as the first pull-down circuit 3300b, the second pull-down circuit 3400b, and the pull-up circuit 3500b of FIG. 7. Also, a calibration device 8000 of FIG. 8 may provide operations corresponding to a calibration device 7000 of FIG. 7.

The calibration device 8000 may include a first operational amplifier 8600, a second operational amplifier 8700, and a reference voltage generator (not illustrated). The calibration device 8000 may not include the control signal generator 3800 of FIG. 7.

The first operational amplifier 8600 may output a control signal PD_CONT to the first pull-down circuit 8300 and the second pull-down circuit 8400. The control signal PD_CONT may be an analog voltage signal for adjusting a resistance value of each of the first pull-down circuit 8300 and the second pull-down circuit 8400. The first operational amplifier 8600 may adjust a level of the control signal PD_CONT by comparing a level of "PD_CAL_VOL" and a level of the reference voltage $V_{REF}$. For example, in the case where the level of "PD_CAL_VOL" is greater than the level of the reference voltage $V_{REF}$, the level of the control signal PD_CONT may become greater; in the case where the level of "PD_CAL_VOL" is smaller than the level of the reference voltage $V_{REF}$, the level of the control signal PD_CONT may become smaller.

Each of the first pull-down circuit 8300 and the second pull-down circuit 8400 may include one or more NMOS transistors. In this case, a source terminal of an NMOS transistor may be connected to the node to which the power supply voltage VSS is supplied.

The first operational amplifier 8600 may adjust the resistance values of the first pull-down circuit 8300 and the second pull-down circuit 8400 by adjusting the level of the control signal PD_CONT. By a current-voltage characteristic of the first pull-down circuit 8300, the resistance value of the first pull-down circuit 8300 may be determined depending on the level of the control signal PD_CONT, a level of a voltage supplied to the first pull-down circuit 8300, a level of a current flowing to the first pull-down circuit 8300. By a current-voltage characteristic of the second pull-down circuit 8400, the resistance value of the second pull-down circuit 8400 may be determined depending on the level of the control signal PD_CONT, a level of a voltage supplied to the second pull-down circuit 8400, a level of a current flowing to the second pull-down circuit 8400. This will be more fully described with reference to FIG. 9.

The second operational amplifier 8700 may output a control signal PU_CONT to the pull-up circuit 8500. The control signal PU_CONT may be an analog voltage signal for adjusting a resistance value of the pull-up circuit 8500. The second operational amplifier 8700 may adjust a level of the control signal PU_CONT by comparing a level of "PD_CAL_VOL" and a level of "PU_CAL_VOL". For example, in the case where the level of "PU_CAL_VOL" is greater than the level of "PD_CAL_VOL", the level of the control signal PU_CONT may become smaller; in the case where the level of "PU_CAL_VOL" is smaller than the level of "PD_CAL_VOL", the level of the control signal PU_CONT may become greater.

The pull-up circuit 8500 may include one or more PMOS transistors. In this case, a source terminal of a PMOS transistor may be connected to the node to which the power supply voltage VDD is supplied.

The second operational amplifier 8700 may adjust the resistance value of the pull-up circuit 8500 by adjusting the level of the control signal PU_CONT. By a current-voltage characteristic of the pull-up circuit 8500, the resistance value of the pull-up circuit 8500 may be determined depending on the level of the control signal PU_CONT, a level of a voltage supplied to the pull-up circuit 8500, a level of a current flowing to the pull-up circuit 8500. This will be more fully described with reference to FIG. 9.

The pull-down calibration operation and the pull-up calibration operation performed in the calibration device 8000 correspond to the pull-down calibration operation and the pull-up calibration operation described with reference to FIG. 4, and thus, additional description will be omitted to avoid redundancy.

Figure 9:
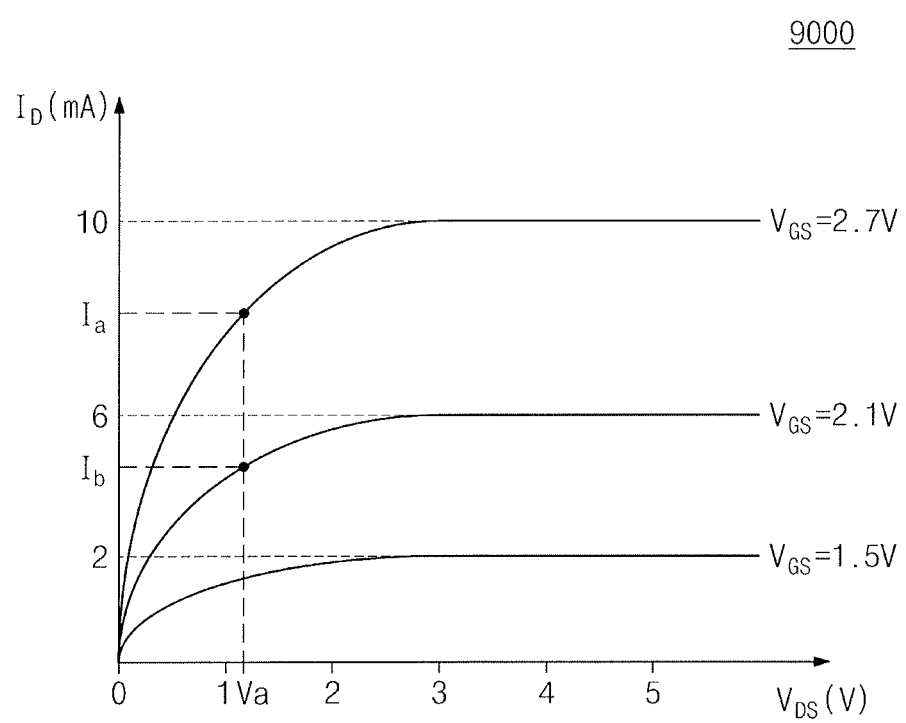
FIG. 9 is a graph illustrating a current-voltage characteristic of a transistor according to an embodiment.

FIG. 9 is a graph illustrating a current-voltage characteristic of a transistor according to an embodiment. For better understanding, FIG. 8 will be referenced together.

A graph 9000 may indicate a current-voltage characteristic of an NMOS transistor included in the first pull-down circuit 8300 and the second pull-down circuit 8400. In the graph 9000, a horizontal axis represents a level of a voltage $V_{DS}$ supplied between a drain and a source of an NMOS transistor, and a vertical axis represents a level of an operation current $I_D$ flowing between the drain and the source of the NMOS transistor. However, levels of the voltages $V_{DS}$ and $V_{GS}$ and the current $I_D$ marked at the graph 9000 correspond to exemplary values, and the embodiments are not limited thereto.

Referring to the graph 9000, an NMOS transistor may have a current-voltage characteristic in which a level of the operation current $I_D$ varies with a level of the voltage $V_{DS}$ supplied to the NMOS transistor and a level of the voltage $V_{GS}$ supplied to a gate of the NMOS transistor. The first operational amplifier 8600 may adjust a level of the voltage $V_{GS}$ to be supplied to gates of transistors included in the first pull-down circuit 8300 and the second pull-down circuit 8400 by adjusting the level of the control signal PD_CONT. For example, a level of the voltage $V_{GS}$ to be supplied to a gate of an NMOS transistor may be the level of the control signal PD_CONT.

A resistance value of an NMOS transistor may be determined by a reciprocal of a slope of a current-voltage curve of the graph 9000. That is, in an interval where a level of the operation current $I_D$ flowing to an NMOS transistor varies, a resistance value of the NMOS transistor may be a value obtained by dividing a level of the voltage $V_{DS}$ across the NMOS transistor by a level of the operation current $I_D$ flowing to the NMOS transistor. In detail, in the case where a level of a drain voltage of the NMOS transistor is $V_a$, a level of a source voltage of the NMOS transistor is "0", and a level of the voltage $V_{GS}$ supplied to a gate of the NMOS transistor is 2.7, a resistance value of the NMOS transistor may be $V_a/I_a$. In this case, if the level of the voltage $V_{GS}$ supplied to the gate of the NMOS transistor is changed to 2.1, the resistance value of the NMOS transistor may be adjusted to $V_a/I_b$.

The first pull-down circuit 8300 may include a plurality of NMOS transistors connected in parallel, and a resistance value of the first pull-down circuit 8300 may vary with the number of NMOS transistors. For example, in the case where the number of NMOS transistors is "N" (N being a positive integer), a level of a drain voltage of an NMOS transistor is $V_a$, a level of a source voltage of the NMOS transistor is "0", and a level of the voltage $V_{GS}$ supplied to a gate of the NMOS transistor is 2.7, a resistance value of the NMOS transistor may be $V_a/(N*I_a)$.

Only a current-voltage characteristic of an NMOS transistor is described with reference to FIG. 9, but a PMOS transistor may also have a current-voltage characteristic in which a level of an operation current flowing between a source and a drain varies with a level of a voltage supplied between the source and the drain of the PMOS transistor and a level of a voltage supplied to a gate of the PMOS transistor. Accordingly, as in the way where the first operational amplifier 8600 adjusts a resistance value of an NMOS transistor by adjusting a level of the control signal PD_CONT, the second operational amplifier 8700 also adjusts a resistance value of a PMOS transistor included in the pull-up circuit 8500 by adjusting a level of the control signal PU_CONT.

Returning to FIG. 1, in the case of the storage device 1000 according to an embodiment, it is possible to implement any one of the pull-up circuit 1222 and the pull-down circuit 1224 with a digital circuit and the other thereof with an analog circuit. For example, in the case where the pull-up circuit 1222 is implemented with a digital circuit and the pull-down circuit 1224 is implemented with an analog circuit, the storage device 1000 may adjust a resistance value of the pull-up circuit 1222 through a digital control signal (e.g., the control signal PU_CODE of FIG. 4) and may adjust a resistance value of the pull-down circuit 1224 through an analog control signal (e.g., the control signal PD_CONT of FIG. 8).

Figure 10:
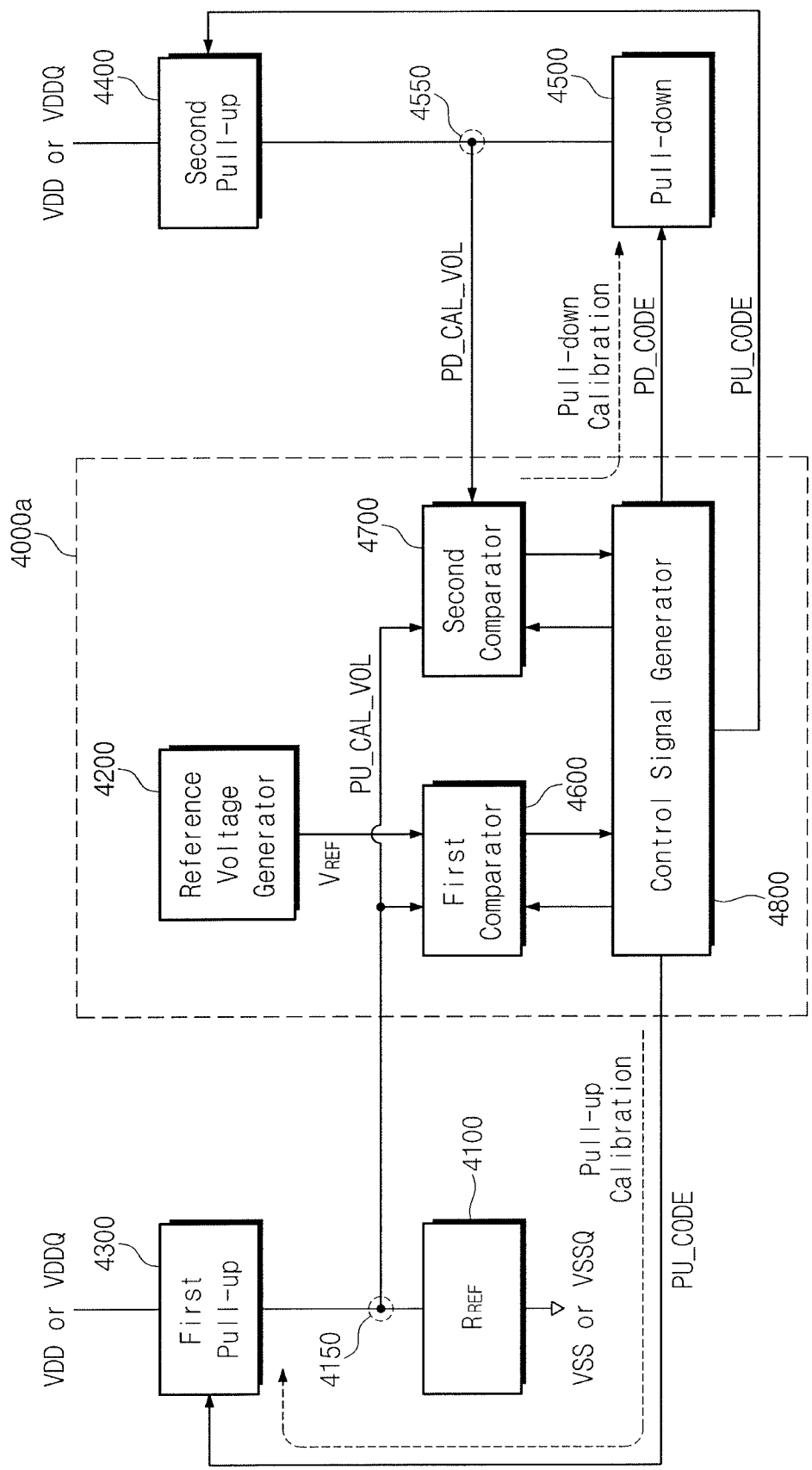
FIG. 10 is a block diagram illustrating a calibration device according to an embodiment.

FIG. 10 is a circuit diagram illustrating a calibration device according to an embodiment.

Unlike the description given with reference to FIGS. 4 to 8, a calibration operation which is performed in the case where a reference resistor 4100 is placed between a node 4150 and a node to which the power supply voltage VSS is supplied will be described with reference to FIGS. 10 to 14. In the case where the reference resistor 4100 is placed between the node 4150 and the node to which the power supply voltage VSS is supplied, a first pull-up circuit 4300, a second pull-up circuit 4400, and a pull-down circuit 4500 may be placed between the node 4150 and a node to which the power supply voltage VDD is supplied, between a node 4550 and the node to which the power supply voltage VDD is supplied, and the node 4550 and the node to which the power supply voltage VSS is supplied, respectively. The node which supplies the power supply voltage VDD to the first pull-up circuit 4300 may be the same as or different from the node which supplies the power supply voltage VDD to the second pull-up circuit 4400. The node which supplies the power supply voltage VSS to the reference resistor 4100 may be the same as or different from the node which supplies the power supply voltage VSS to the pull-down circuit 4500.

Components 4200, 4600, 4700, and 4800 of a calibration device 4000a illustrated in FIG. 10 may provide operations corresponding to the components 3200, 3600, 3700, and 3800 of the calibration device 4000 illustrated in FIG. 4.

The calibration device 4000a may indicate one of the calibration device 1240 and the calibration device 1440 of FIG. 1. The calibration device 4000a may include the reference voltage generator 4200, the first comparator 4600, the second comparator 4700, and the control signal generator 4800. The calibration device 4000a may perform a calibration operation for adjusting resistance values of the first pull-up circuit 4300, the second pull-up circuit 4400, and the pull-down circuit 4500.

The second pull-up circuit 4400 may include the same circuit as a circuit included in the first pull-up circuit 4300, and a control signal which the second pull-up circuit 4400 may receive may have the same logical value as a control signal which the first pull-up circuit 4300 receives. Accordingly, the second pull-up circuit 4400 may be calibrated (or controlled) to have the same resistance value as the resistance value of the first pull-up unit 4300. The first pull-up circuit 4300 and the second pull-up circuit 4400 may be included in the pull-up circuit 1222 of FIG. 1. Alternatively, the first pull-up circuit 4300 and the second pull-up circuit 4400 may be included in the pull-up circuit 1422 of FIG. 1. The second pull-up circuit 4400 may be used for a calibration operation of the pull-down circuit 4500.

The pull-down circuit 4500 may be included in the pull-down circuit 1224 or the pull-down circuit 1424 of FIG. 1.

The first comparator 4600 may compare a level of "PU_CAL_VOL" and a level of the reference voltage $V_{REF}$ and may output a first comparison result. The control signal generator 4800 may output a control signal PU_CODE for adjusting the resistance value of the first pull-up circuit 4300 to the first pull-up circuit 4300, based on the first comparison result received. The control signal generator 4800 may output the control signal PU_CODE for adjusting the resistance value of the second pull-up circuit 4400 to the second pull-up circuit 4400.

"PU_CAL_VOL" is a voltage of the node 4150 placed between the reference resistor 4100 and the first pull-up circuit 4300. "PU_CAL_VOL" may be supplied from the power supply voltage VSS, and a level of "PU_CAL_VOL" may be determined depending on a value of the reference resistor 4100 and a resistance value of the first pull-up circuit 4300. For example, a level of "PU_CAL_VOL" may be determined depending on Equation 4.

$$\text{PU\_CAL\_VOL} = VSS + (VDD - VSS) \times \frac{R_{REF}}{(R_{REF} + R_{pull-up\_1})} \quad \text{[Equation 4]}$$

Where $R_{pull-up\_1}$ is a resistance value of the first pull-up circuit 4300 and $R_{REF}$ is a value of the reference resistor 4100.

Accordingly, a level of "PU_CAL_VOL" may be changed as the resistance value of the first pull-up circuit 4300 is changed.

Below, an operation of the first comparator 4600 and the control signal generator 4800 to be described with reference to FIG. 10 corresponds to an operation of the first comparator 3600 and the control signal generator 3800 described with reference to FIG. 4, and thus, additional description will be omitted to avoid redundancy.

The second comparator 4700 may compare a level of "PU_CAL_VOL" and a level of "PD_CAL_VOL" and may output a second comparison result. The control signal generator 4800 may output a control signal PD_CODE for adjusting the resistance value of the pull-down circuit 4500 to the pull-down circuit 4500, based on the second comparison result received.

"PD_CAL_VOL" is a voltage of the node 4550 placed between the pull-down circuit 4500 and the second pull-up circuit 4400. "PD_CAL_VOL" may be supplied from the power supply voltage VSS, and a level of "PD_CAL_VOL" may be determined depending on a resistance value of the pull-down circuit 4500 and a resistance value of the second pull-up circuit 4400. For example, "PD_CAL_VOL" may be determined depending on Equation 5.

$$\text{PD\_CAL\_VOL} = VSS + (VDD - VSS) \times \frac{R_{pull-down}}{(R_{pull-up\_2} + R_{pull-down})} \quad \text{[Equation 5]}$$

Where $R_{pull-up\_2}$ is a resistance value of the second pull-up circuit 4400 completely calibrated and $R_{pull-down}$ is a resistance value of the pull-down circuit 4500.

Accordingly, "PD_CAL_VOL" may be changed as the resistance value of the pull-down circuit 4500 may be changed.

Below, an operation of the second comparator 4700 and the control signal generator 4800 to be described with reference to FIG. 10 corresponds to the operation of the second comparator 3700 and the control signal generator 3800 described with reference to FIG. 4, and thus, additional description will be omitted to avoid redundancy.

Figure 11:
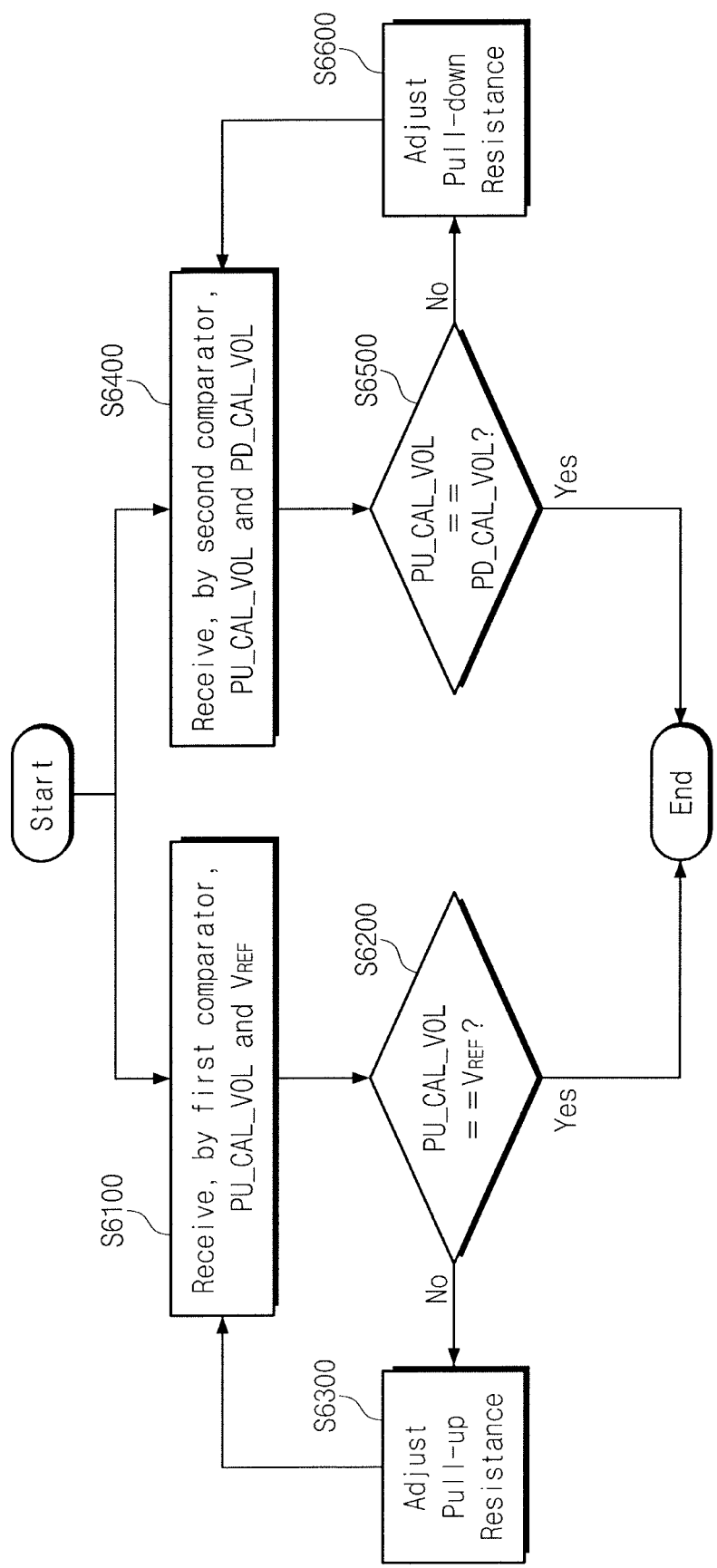
FIG. 11 is a flowchart illustrating a method in which a calibration device of FIG. 10 performs a calibration operation.

FIG. 11 is a flowchart illustrating a method in which a calibration device of FIG. 10 performs a calibration operation.

In operation S6100, the first comparator 4600 may receive "PU_CAL_VOL" and the reference voltage $V_{REF}$.

In operation S6200, the first comparator 4600 may compare a level of "PU_CAL_VOL" and a level of the reference voltage $V_{REF}$.

In the case where the level of "PU_CAL_VOL" is different from the level of the reference voltage $V_{REF}$, in operation S6300, the control signal generator 4800 may adjust a resistance value of the first pull-up circuit 4300. The level of "PU_CAL_VOL" may be changed as the resistance value of the first pull-up circuit 4300 is adjusted, and the changed level of "PU_CAL_VOL" may be again compared with the level of the reference voltage $V_{REF}$ in operation S6100.

In the case where the resistance value of the first pull-up circuit 4300 is the same as the value of the reference resistor 4100, the level of "PU_CAL_VOL" may be the same as the level of the reference voltage $V_{REF}$. If the level of "PU_CAL_VOL" is the same as the level of the reference voltage $V_{REF}$, the pull-up calibration operation may be terminated.

In operation S6400, the second comparator 4700 may receive "PD_CAL_VOL" and "PU_CAL_VOL". "PD_CAL_VOL" may be supplied from the power supply voltage VSS, and a level of "PD_CAL_VOL" may be determined depending on a resistance value of the pull-down circuit 4500 and a resistance value of the second pull-up circuit 4400.

In operation S6500, the second comparator 4700 may compare a level of "PD_CAL_VOL" and a level of "PU_CAL_VOL".

In the case where the level of "PD_CAL_VOL" is different from the level of "PU_CAL_VOL", in operation S6600, the control signal generator 4800 may adjust the resistance value of the pull-down circuit 4500. The level of "PD_CAL_VOL" may be changed as the resistance value of the pull-down circuit 4500 is adjusted, and the changed level of "PD_CAL_VOL" may be again compared with the level of "PU_CAL_VOL" in operation S6400.

In the case where the resistance value of the pull-down circuit 4500 is the same as the resistance value of the second pull-up circuit 4400, the level of "PD_CAL_VOL" may be the same as the level of "PU_CAL_VOL". If the level of "PD_CAL_VOL" is the same as the level of "PU_CAL_VOL", the pull-down calibration operation may be terminated. That is, the calibration operation including the pull-down calibration operation and the pull-up calibration operation in the case where the resistance values of the pull-up circuits 4300 and 4400 and the pull-down circuit 4500 are the same as the value of the reference resistor 4100 may be terminated.

The pull-up calibration operation which is performed by repeating operation S6100, operation S6200, and operation S6300 and the pull-down calibration operation which is performed by repeating operation S6400, operation S6500, and operation S6600 may be independent of each other. Accordingly, a total time taken to perform the calibration operation may decrease.

Figure 12:
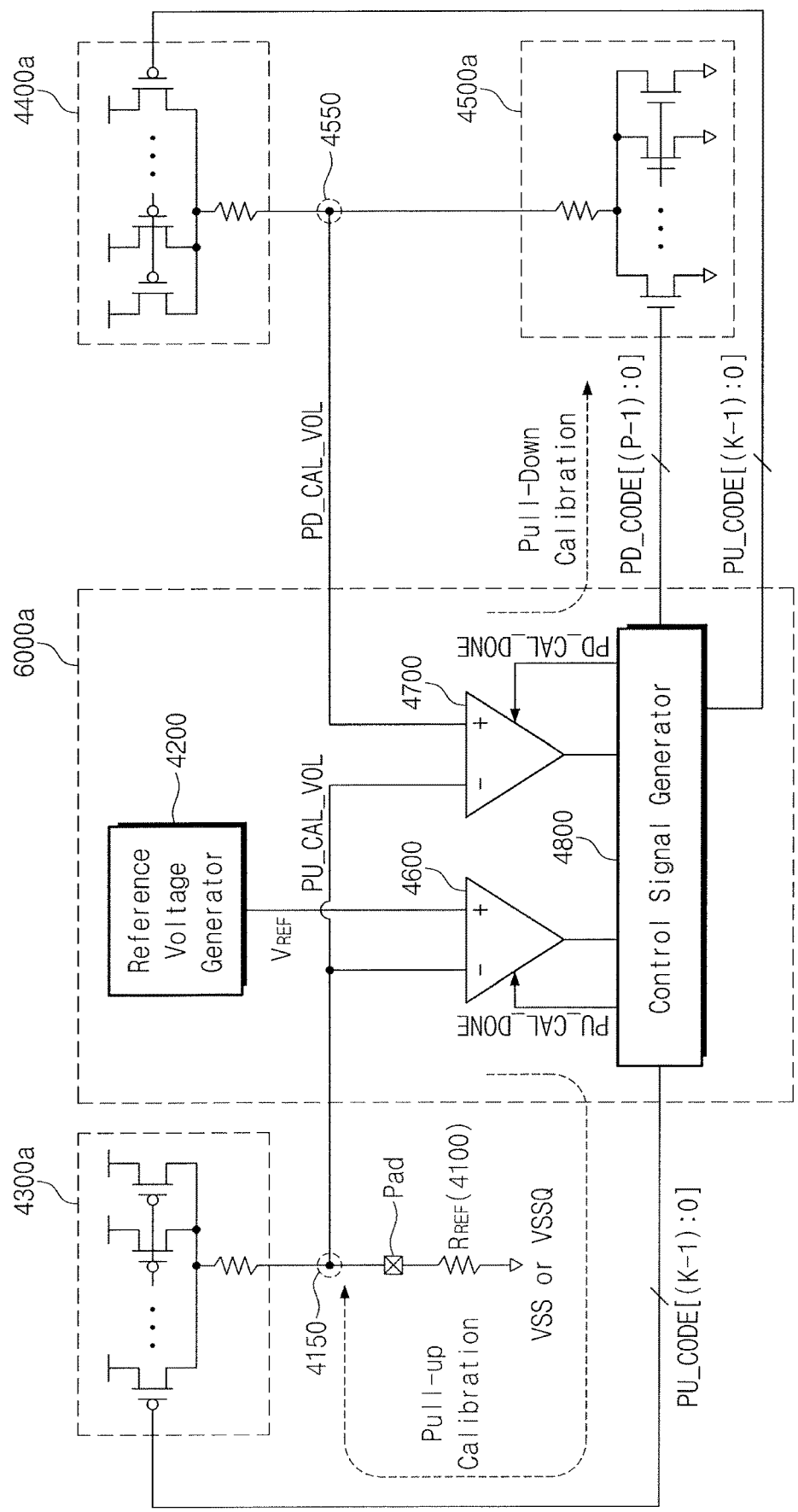
FIG. 12 is a circuit diagram illustrating an exemplary configuration of a calibration device of FIG. 10.

FIG. 12 is a circuit diagram illustrating an exemplary configuration of a calibration device of FIG. 10. For better understanding, FIG. 6 will be referenced together.

Components illustrated in FIG. 12 may provide operations corresponding to the components illustrated in FIG. 10. Thus, additional description will be omitted to avoid redundancy.

Each of a first pull-up circuit 4300a and a second pull-up circuit 4400a may include "K" transistors (K being a positive integer) connected in parallel and a single resistor. Also, a pull-down circuit 4500a may include "P" transistors (P being a positive integer) connected in parallel and a single resistor.

In the case where the reference resistor 4100 is placed between the node 4150 and the node to which the power supply voltage VSS is supplied, unlike the description given with reference to FIG. 6, each of the "K" transistors included in each of the first pull-up circuit 4300a and the second pull-up circuit 4400a may be a PMOS transistor. In this case, a source terminal of a PMOS transistor may be connected to the node to which the power supply voltage VDD is supplied. Also, each of the "P" transistors included in the pull-down circuit 4500a may be an NMOS transistor. In this case, a source terminal of an NMOS transistor may be connected to the node to which the power supply voltage VSS is supplied.

The control signal generator 4800 may adjust resistance values of the first pull-up circuit 4300a, the second pull-up circuit 4400a, and the pull-down circuit 4500a. A control signal which the control signal generator 4800 outputs to turn on or turn off transistors included in each of the first pull-up circuit 4300a, the second pull-up circuit 4400a, and the pull-down circuit 4500a may be similar to the control signal described with reference to FIG. 6.

However, in the case where the control signal generator 4800 outputs the control signal PU_CODE[2:0] including a bit string of "101" to the first pull-up circuit 4300a, a first transistor and a third transistor of the first pull-up circuit 4300a may be turned off, and a second transistor thereof may be turned on. Also, in the case where the control signal generator 4800 outputs the control signal PD_CODE[2:0] including a bit string of "101" to the pull-down circuit 4500a, a first transistor and a third transistor of the pull-down circuit 4500a may be turned on, and a second transistor thereof may be turned off.

Figure 13:
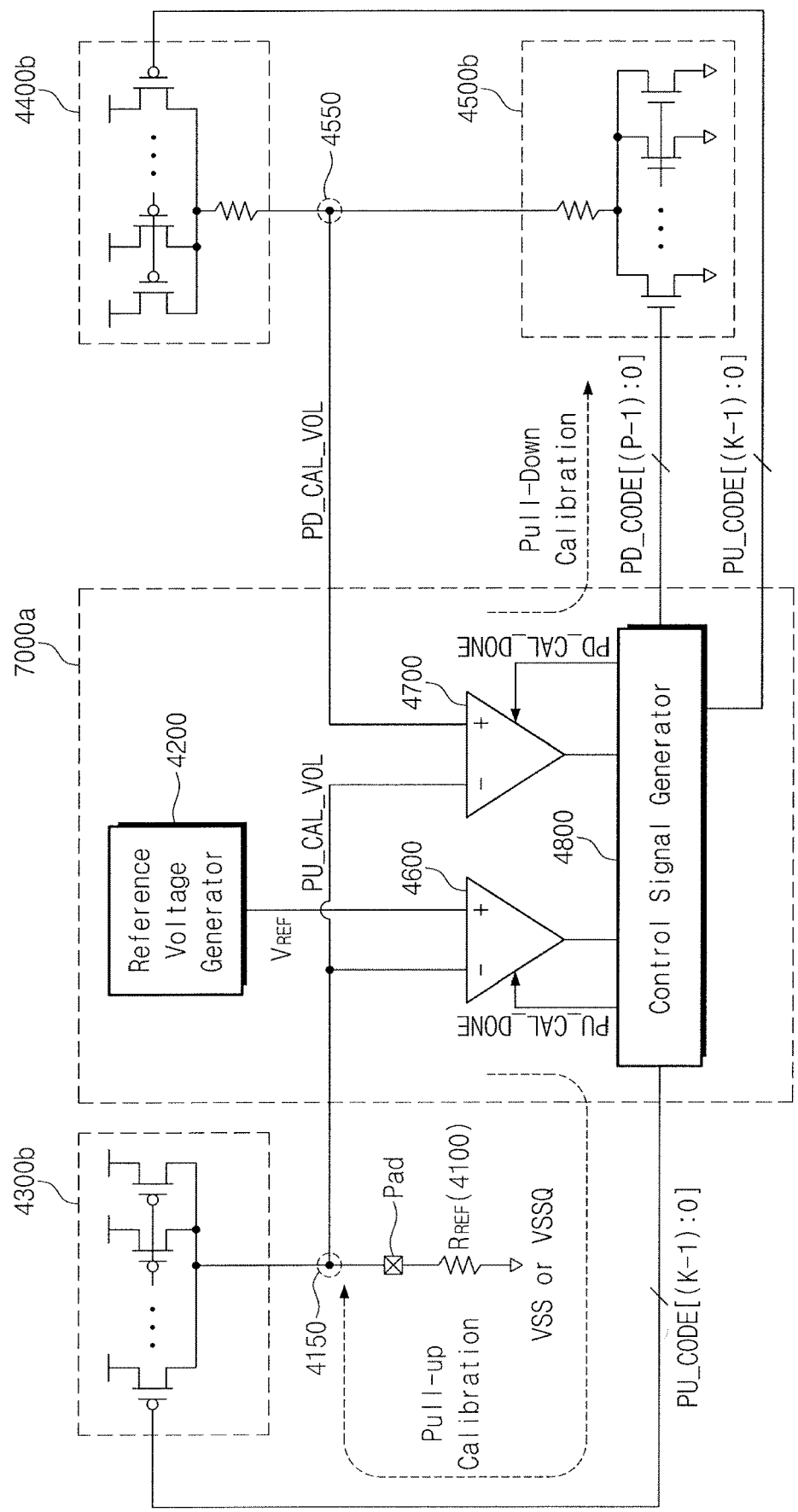
FIG. 13 is a circuit diagram illustrating an exemplary configuration of a calibration device of FIG. 10.

FIG. 13 is a circuit diagram illustrating an exemplary configuration of a calibration device of FIG. 10.

Components illustrated in FIG. 13 may provide operations corresponding to the components illustrated in FIG. 12.

A first pull-up circuit 4300b and a second pull-up circuit 4400b of FIG. 13 are different from the first pull-up circuit 4300a and the second pull-up circuit 4400a of FIG. 12 in that the first pull-up circuit 4300b and the second pull-up circuit 4400b do not include a resistor. That is, each of the first pull-up circuit 4300b and the second pull-up circuit 4400b may include only "N" transistors (N being a positive integer) connected in parallel.

Unlike the pull-down circuit 4500a, also, a pull-down circuit 4500b may not include a resistor. That is, the pull-down circuit 4500b may include only "M" transistors (M being a positive integer) connected in parallel.

A calibration operation to be performed by components illustrated in FIG. 13 is substantially the same as the calibration operation described with reference to FIG. 12, and thus, additional description will be omitted to avoid redundancy.

Figure 14:
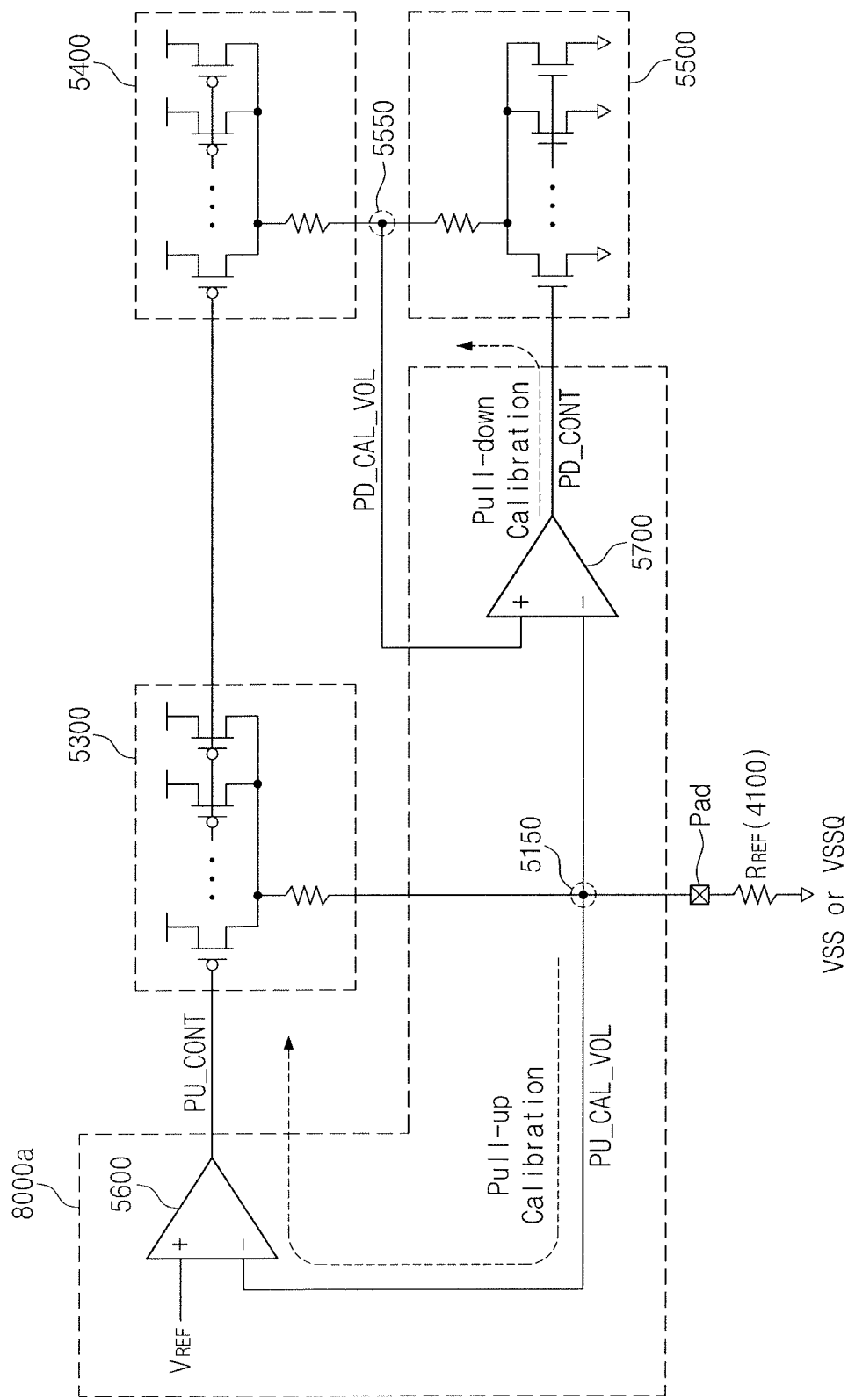
FIG. 14 is a circuit diagram illustrating a calibration device according to an embodiment.

FIG. 14 is a circuit diagram illustrating a calibration device according to an embodiment.

A first pull-up circuit 5300, a second pull-up circuit 5400, and a pull-down circuit 5500 of FIG. 14 may be substantially the same as the first pull-up circuit 4300b, the second pull-up circuit 4400b, and the pull-down circuit 4500b of FIG. 13.

A calibration device 8000a may include the first operational amplifier 5600, a second operational amplifier 5700, and a reference voltage generator (not illustrated). The calibration device 8000a may not include the control signal generator 4800.

The calibration device 8000a may adjust resistance values of the first pull-up circuit 5300, the second pull-up circuit 5400, and the pull-down circuit 5500. The calibration device 8000a may operate similarly to the calibration device 8000 of FIG. 8 for the purpose of adjusting resistance values of the first pull-up circuit 5300, the second pull-up circuit 5400, and the pull-down circuit 5500. Thus, additional description will be omitted to avoid redundancy.

However, the first operational amplifier 5600 may compare a level of "PU_CAL_VOL" and a level of the reference voltage $V_{REF}$ and may adjust the resistance values of the first pull-up circuit 5300 and the second pull-up circuit 5400 including PMOS transistors. In this case, a source terminal of a PMOS transistor may be connected to the node to which the power supply voltage VDD is supplied. Also, the second operational amplifier 5700 may compare the level of "PU_CAL_VOL" and a level of "PD_CAL_VOL" and may adjust the resistance value of the pull-down circuit 5500 including NMOS transistors. In this case, a source terminal of an NMOS transistor may be connected to the node to which the power supply voltage VSS is supplied.

Figure 15:
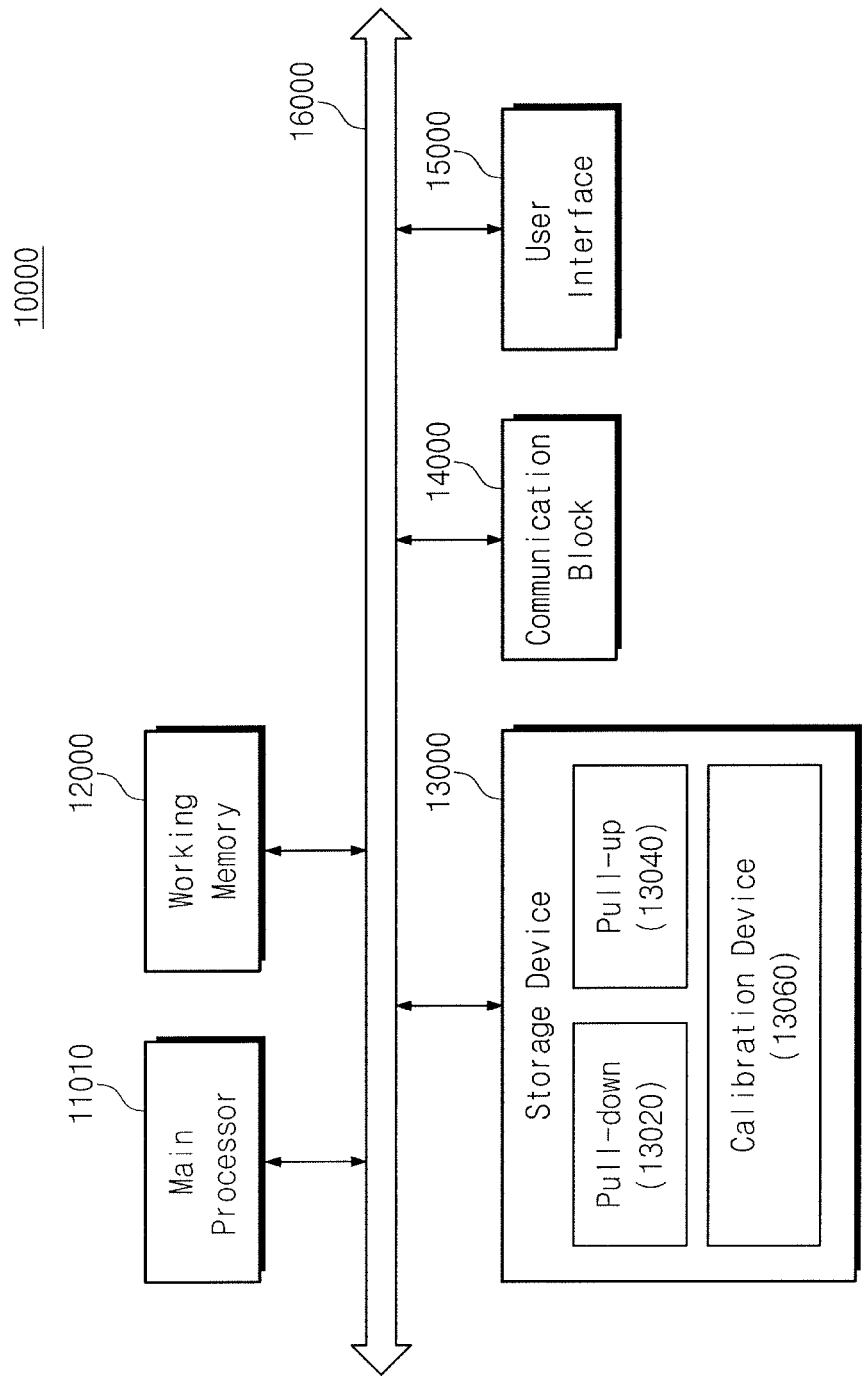
FIG. 15 is a block diagram illustrating a configuration of an electronic system according to an embodiment.

FIG. 15 is a block diagram illustrating a configuration of an electronic system according to an embodiment.

An electronic system 10000 may include a main processor 11010, a working memory 12000, a storage device 13000, a communication block 14000, a user interface 15000, and a bus 16000. For example, the electronic system 10000 may be one of electronic devices such as a desktop computer, a laptop computer, a tablet computer, a smartphone, a wearable device, a video game console, a workstation, a server, etc.

The main processor 11010 may control overall operations of the electronic system 10000. The main processor 11010 may process various kinds of arithmetic operations and/or logical operations. To this end, the main processor 11010 may include a special-purpose logic circuit (e.g., a field programmable gate array (FPGA) or application specific integrated chips (ASICs)). For example, the main processor 11010 may include one or more processor cores and may be implemented with a general-purpose processor, a special-purpose processor, or an application processor.

The working memory 12000 may store data to be used for an operation of the electronic system 10000. For example, the working memory 12000 may temporarily store data that are processed or will be processed by the main processor 11010. For example, the working memory 12000 may include a volatile memory, such as a DRAM, an SDRAM, or the like, and/or a non-volatile memory, such as a PRAM, an MRAM, a ReRAM, an FRAM, or the like.

The storage device 13000 may include a memory device and a controller. The memory device of the storage device 13000 may store data regardless of power supply. For example, the storage device 13000 may include a non-volatile memory such as a flash memory, a PRAM, an MRAM, a ReRAM, an FRAM, or the like. For example, the storage device 13000 may include a storage medium such as a solid state drive (SSD), an embedded multimedia card (eMMC), universal flash storage (UFS), or the like. The controller may control the memory device such that the memory device stores or outputs data.

An interface operation between the memory device and the controller of the storage device 13000 may be performed based on an analog voltage signal. The storage device 1300 may exactly adjust a level of the analog voltage signal by using a pull-down circuit 13020 and a pull-up circuit 13040. For convenience of description, only one pull-down circuit 13020 and only one pull-up circuit 13040 are illustrated, but each of the controller and the memory device in the storage device 13000 may include a pull-down resistor and a pull-up resistor.

However, values of the pull-down circuit 13020 and the pull-up circuit 13040 may vary with the PVT condition. If the values of the pull-down circuit 13020 and the pull-up circuit 13040 are changed, a level of an analog voltage signal between the controller and the memory device is also changed. Thus, the storage device 13000 may operate abnormally or data output from the storage device 13000 may be damaged.

A calibration device 13060 of the storage device 13000 may adjust a resistance value of the pull-down circuit 13020 and a resistance value of the pull-up circuit 13040 independently. For example, the calibration device 13060 may adjust the resistance value of the pull-down circuit 13020 and the resistance value of the pull-up circuit 13040 independently, based on the method described with reference to FIGS. 3 to 8. According to an embodiment, if a pull-down calibration operation and a pull-up calibration operation are completed, the resistance value of the pull-down circuit 13020 and the resistance value of the pull-up circuit 13040 may be the same as a value of a reference resistor outside the storage device 13000.

The communication block 14000 may communicate with an external device/system of the electronic system 10000. For example, the communication block 14000 may support at least one of various wireless communication protocols such as long term evolution (LTE), worldwide interoperability for microwave access (WiMax), global system for mobile communication (GSM), code division multiple access (CDMA), Bluetooth, near field communication (NFC), and wireless fidelity (Wi-Fi), radio frequency identification (RFID) and/or at least one of various wired communication protocols such as transfer control protocol/Internet protocol (TCP/IP), universal serial bus (USB), and Firewire.

The user interface 15000 may perform communication arbitration between a user and the electronic system 10000. For example, the user interface 15000 may include input interfaces such as a keyboard, a mouse, a keypad, a button, a touch panel, a touch screen, a touch pad, a touch ball, a camera, a microphone, a gyroscope sensor, and a vibration sensor. For example, the user interface 15000 may include output interfaces such as a liquid crystal display (LCD) device, a light emitting diode (LED) display device, an organic LED (OLED) display device, an active matrix OLED (AMOLED) display device, a speaker, and a motor.

The bus 16000 may provide a communication path between the components of the electronic system 10000. The components of the electronic system 10000 may exchange data with each other based on a bus format of the bus 16000. For example, a bus format may include one or more of various interface protocols such as USB, small computer system interface (SCSI), peripheral component interconnect express (PCIe), mobile PCIe (M-PCIe), advanced technology attachment (ATA), parallel ATA (PATA), serial ATA (SATA), serial attached SCSI (SAS), integrated drive electronics (IDE), enhanced IDE (EIDE), nonvolatile memory express (NVMe), and universal flash storage (UFS).

By way of summation and review, values of the pull-up and pull-down resistors may vary with a process, voltage, and temperature (PVT) condition. While a semiconductor memory device may perform a calibration operation for maintaining the values of the pull-up and pull-down resistors at a given value, this calibration may be sequential. Sequential calibration may take a long time and may generate less accurate calibration, as failure to correctly calibrate one component may affect calibration of the next component.

Embodiments provide a calibration device that may calibrate a pull-up resistor and a pull-down resistor independently and in parallel, which may allow faster and more accurate calibration, and a storage device including the calibration device.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A calibration device comprising:
    a first comparator configured to output a first comparison result of comparing a level of a first voltage of a first node and a level of a reference voltage;
    a second comparator configured to output a second comparison result of comparing the level of the first voltage and a level of a second voltage of a second node; and
    a control signal generator configured to output a first control signal for adjusting a first resistance value of a first resistor circuit based on the first comparison result, to output a second control signal for adjusting a second resistance value of a second resistor circuit based on the second comparison result while outputting the first control signal, and to output a first done signal for stopping the comparing of the first comparator,
        wherein the second comparator is further configured to output the second comparison result before the control signal generator outputs the first done signal,
        wherein the first node is between the first resistor circuit and a reference resistor, and
        wherein the second node is between the second resistor circuit and a third resistor circuit, a third resistance value of the third resistor circuit being adjusted to have the same resistance value as the first resistance value.

2. The calibration device of claim 1, wherein the control signal generator is further configured to:
    output the first done signal when the first comparison result indicates that the level of the first voltage is the same as the level of the reference voltage.

3. The calibration device of claim 1, wherein the first resistor circuit includes first transistors connected in parallel,
    wherein the second resistor circuit includes second transistors connected in parallel,
    wherein each of the first transistors is turned on or is turned off based on the first control signal, and
    wherein each of the second transistors is turned on or is turned off based on the second control signal.

4. The calibration device of claim 3, wherein the control signal generator outputs the first control signal including a bit string for turning on or turning off each of the first transistors based on the first comparison result and outputs the second control signal including a bit string for turning on or turning off each of the second transistors based on the second comparison result.

5. The calibration device of claim 1, wherein the third resistor circuit includes the same circuit as the first resistor circuit, and
    wherein the third resistance value of the third resistor circuit is adjusted based on the first control signal such that the third resistance value becomes identical to the first resistance value.

6. The calibration device of claim 5, wherein the first resistor circuit is between the first node and a third node to which a first supply voltage is applied,
    wherein the reference resistor is between the first node and a fourth node to which a second supply voltage is applied,
    wherein the third resistor circuit is between the second node and a fifth node to which the first supply voltage is applied, and
    wherein the second resistor circuit is between the second node and a sixth node to which the second supply voltage is applied.

7. The calibration device of claim 6, wherein a level of the first supply voltage is lower than a level of the second supply voltage,
    wherein the first resistor circuit and the third resistor circuit include NMOS transistors connected in parallel, and
    wherein the second resistor circuit includes PMOS transistors connected in parallel.

8. The calibration device of claim 6, wherein a level of the first supply voltage is higher than a level of the second supply voltage,
    wherein the first resistor circuit and the third resistor circuit include PMOS transistors connected in parallel, and
    wherein the second resistor circuit includes NMOS transistors connected in parallel.

9. The calibration device of claim 1, wherein the control signal generator is further configured to:
    output a second done signal for stopping the comparing of the second comparator when the second comparison result indicates that the level of the first voltage is the same as the level of the second voltage.

10. A calibration device, comprising:
    a first operational amplifier configured to output a first control signal for adjusting a first resistance value of a first resistor circuit by comparing a level of a first voltage of a first node and a level of a reference voltage; and
    a second operational amplifier configured to output a second control signal for adjusting a second resistance value of a second resistor circuit by comparing the level of the first voltage and a level of a second voltage of a second node,
        wherein the second operational amplifier is further configured to output the second control signal before the first operational amplifier stops the comparing,
        wherein the first node is between the first resistor circuit and a reference resistor,
        wherein the second node is between the second resistor circuit and a third resistor circuit, a third resistance value of the third resistor circuit being adjusted to have the same resistance value as the first resistance value, wherein the first resistor circuit is between the first node and a node to which a first supply voltage is applied, wherein the reference resistor is between the first node and a node to which a second supply voltage is applied, wherein the third resistor circuit is between the second node and a node to which the first supply voltage is applied, wherein the second resistor circuit is between the second node and a node to which the second supply voltage is applied, wherein the first resistor circuit includes one or more NMOS transistors connected in parallel.

11. The calibration device of claim 10, wherein the first control signal and the second control signal are an analog voltage signal, wherein the first resistance value is determined based on the first control signal and a current-voltage characteristic of one or more transistors included in the first resistor circuit.

12. The calibration device of claim 10, wherein the third resistor circuit includes the same circuit as the first resistor circuit, and wherein the third resistance value of the third resistor circuit is adjusted based on the first control signal such that the third resistance value becomes identical to the first resistance value.

13. The calibration device of claim 10, wherein the third resistor circuit includes one or more NMOS transistors connected in parallel, and wherein the second resistor circuit includes one or more PMOS transistors connected in parallel.

14. The calibration device of claim 10, wherein the first control signal and the second control signal are an analog voltage signal, wherein the second resistance value is determined based on the second control signal and a current-voltage characteristic of one or more transistors included in the second resistor circuit.

* * * * *